(12) United States Patent
Huang et al.

(10) Patent No.: US 12,009,265 B2
(45) Date of Patent: Jun. 11, 2024

(54) SLOT CONTACTS AND METHOD FORMING SAME

(71) Applicant: Taiwan Semiconductor Manufacturing Co., Ltd., Hsinchu (TW)

(72) Inventors: Lin-Yu Huang, Hsinchu (TW); Li-Zhen Yu, New Taipei (TW); Sheng-Tsung Wang, Hsinchu (TW); Jia-Chuan You, Dayuan Township (TW); Chia-Hao Chang, Hsinchu (TW); Tien-Lu Lin, Hsinchu (TW); Yu-Ming Lin, Hsinchu (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/068,110

(22) Filed: Dec. 19, 2022

(65) Prior Publication Data

US 2023/0119732 A1     Apr. 20, 2023

Related U.S. Application Data

(60) Continuation of application No. 17/178,762, filed on Feb. 18, 2021, now Pat. No. 11,532,518, which is a
(Continued)

(51) Int. Cl.
*H01L 21/8234*     (2006.01)
*H01L 21/033*      (2006.01)
(Continued)

(52) U.S. Cl.
CPC .. *H01L 21/823475* (2013.01); *H01L 21/0337* (2013.01); *H01L 21/3086* (2013.01); *H01L 21/76897* (2013.01); *H01L 21/823431* (2013.01); *H01L 21/823437* (2013.01); *H01L 27/0886* (2013.01); *H01L 29/66545* (2013.01);
(Continued)

(58) Field of Classification Search
None
See application file for complete search history.

(56) References Cited

U.S. PATENT DOCUMENTS 10,062,784 B1    8/2018   Lee et al.
10,096,693 B2    10/2018  Ching et al.
(Continued)

FOREIGN PATENT DOCUMENTS

CN    106549059 A      3/2017
KR    20050002364 A    1/2005
TW    201712866 A      4/2017

*Primary Examiner* — Asok K Sarkar
(74) *Attorney, Agent, or Firm* — Slater Matsil, LLP

(57) ABSTRACT

A method of forming an integrated circuit structure includes forming a first source/drain contact plug over and electrically coupling to a source/drain region of a transistor, forming a first dielectric hard mask overlapping a gate stack, recessing the first source/drain contact plug to form a first recess, forming a second dielectric hard mask in the first recess, recessing an inter-layer dielectric layer to form a second recess, and forming a third dielectric hard mask in the second recess. The third dielectric hard mask contacts both the first dielectric hard mask and the second dielectric hard mask.

20 Claims, 37 Drawing Sheets

Related U.S. Application Data division of application No. 16/373,215, filed on Apr. 2, 2019, now Pat. No. 10,943,829.

(60) Provisional application No. 62/749,207, filed on Oct. 23, 2018.

(51) Int. Cl.
| | |
|---|---|
| *H01L 21/308* | (2006.01) |
| *H01L 21/768* | (2006.01) |
| *H01L 27/088* | (2006.01) |
| *H01L 29/66* | (2006.01) |
| *H01L 29/78* | (2006.01) |

(52) U.S. Cl.
CPC .... *H01L 29/66795* (2013.01); *H01L 29/7851* (2013.01); *H01L 2029/7858* (2013.01)

(56) References Cited

U.S. PATENT DOCUMENTS

| | | |
|---|---|---|
| 2002/0195686 A1 | 12/2002 | Kim et al. |
| 2016/0149036 A1 | 5/2016 | Huang et al. |
| 2017/0084714 A1 | 3/2017 | Ching et al. |
| 2017/0117406 A1 | 4/2017 | Kim et al. |
| 2017/0186849 A1 | 6/2017 | Chen et al. |
| 2017/0256456 A1 | 9/2017 | Lee et al. |
| 2017/0256613 A1 | 9/2017 | Fung |
| 2017/0345914 A1 | 11/2017 | Smith et al. |
| 2020/0126797 A1 | 4/2020 | Wang et al. |
| 2020/0258746 A1 | 8/2020 | Wang et al. |
| 2020/0328308 A1 | 10/2020 | Chang et al. |

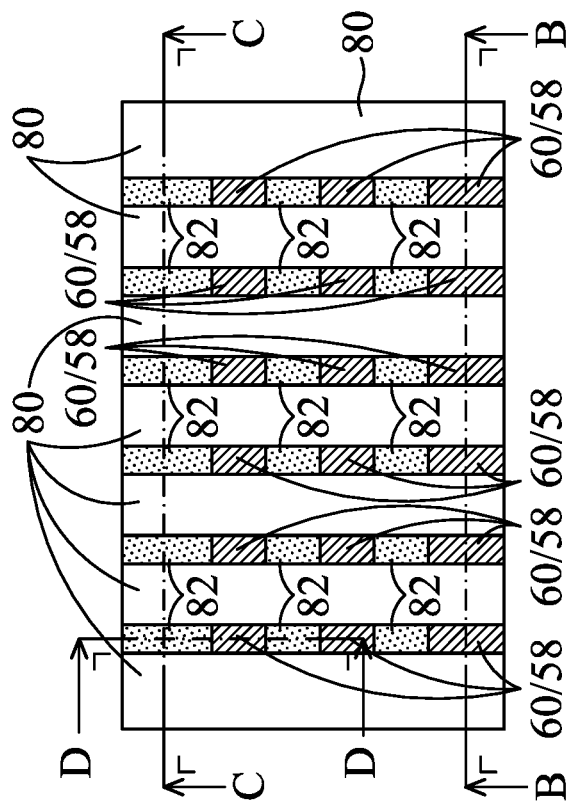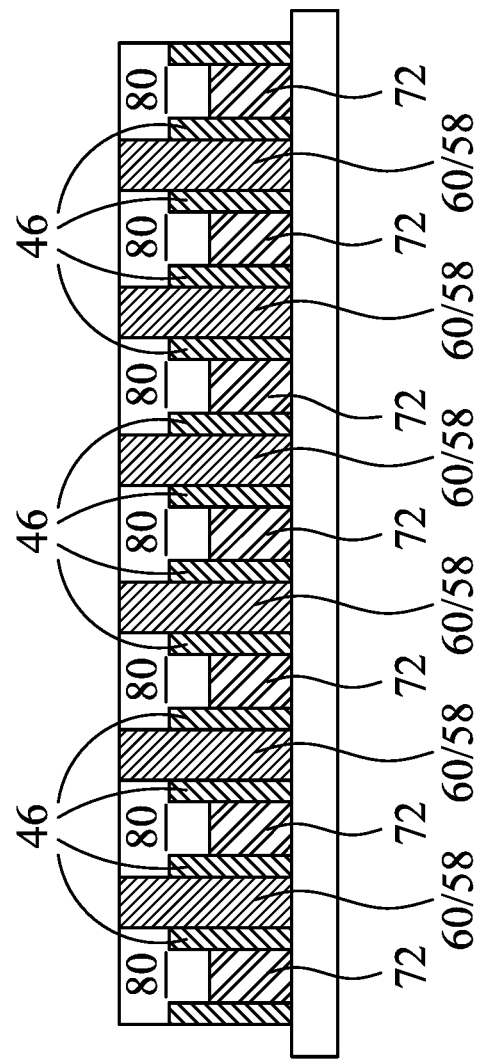

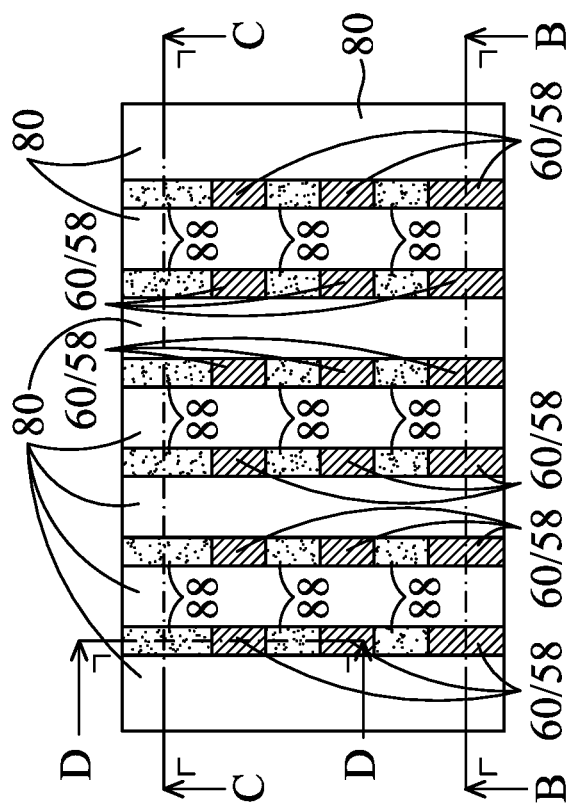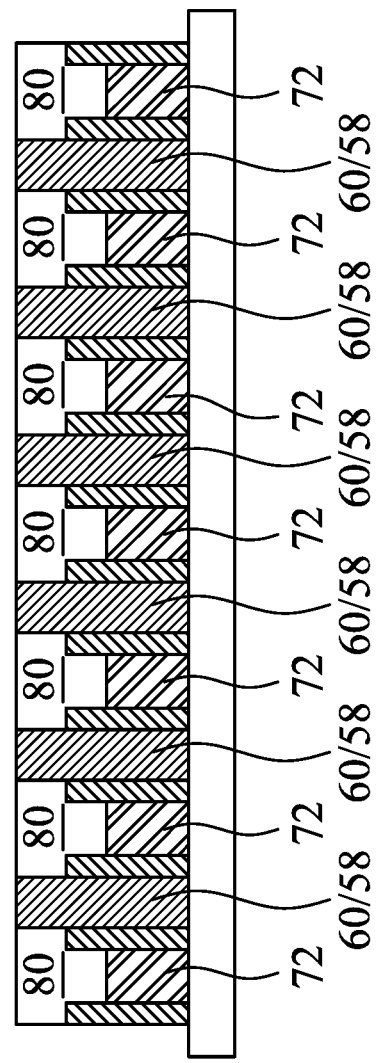
FIG. 13A
FIG. 13B

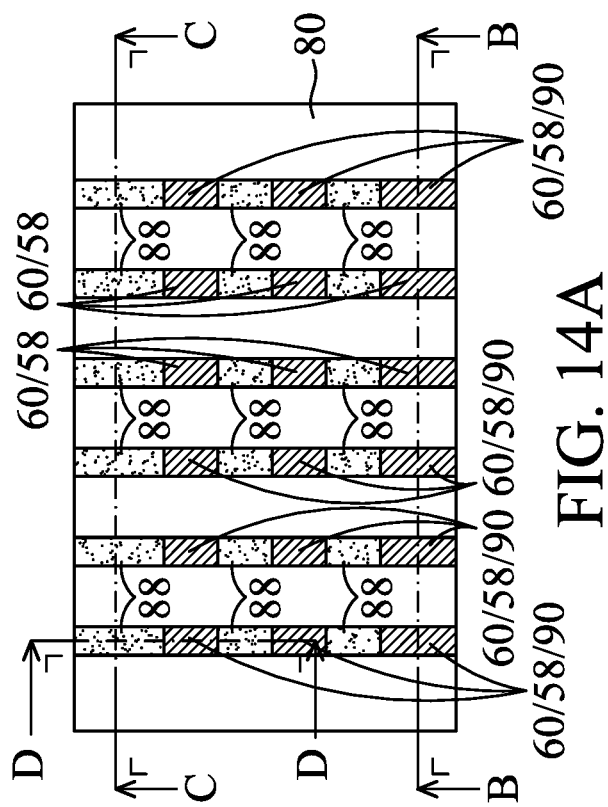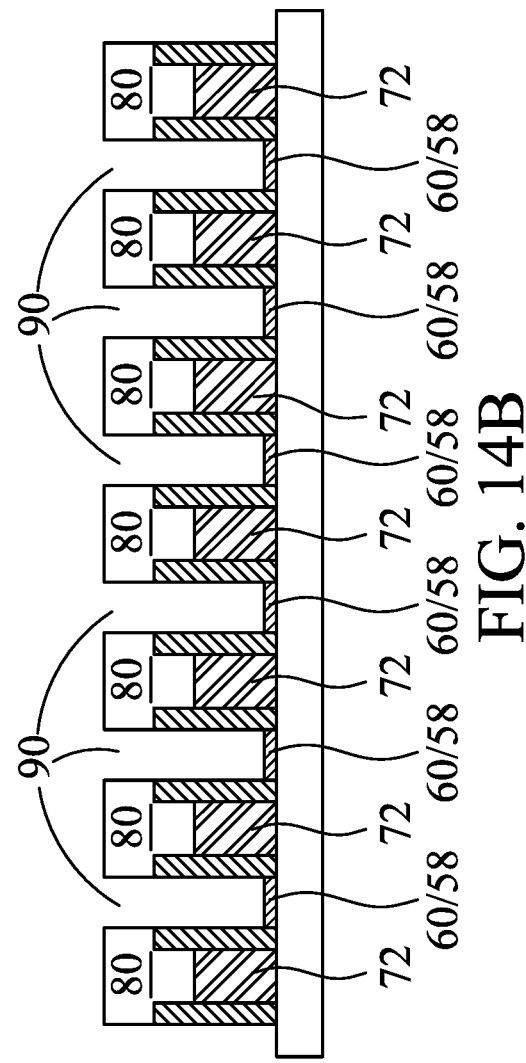
FIG. 14A
FIG. 14B

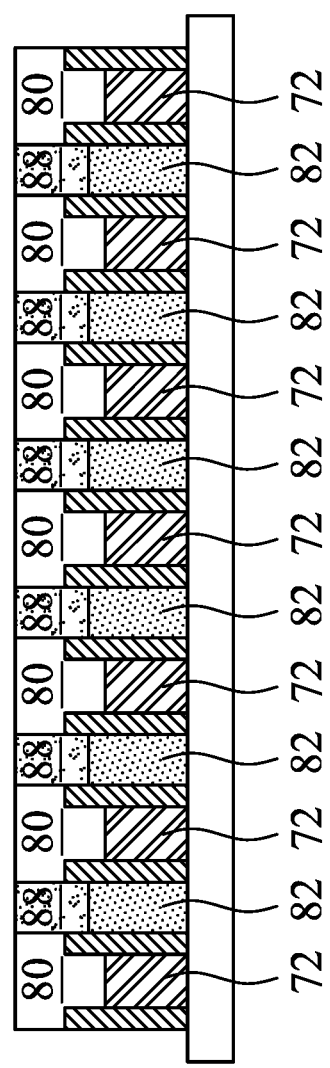
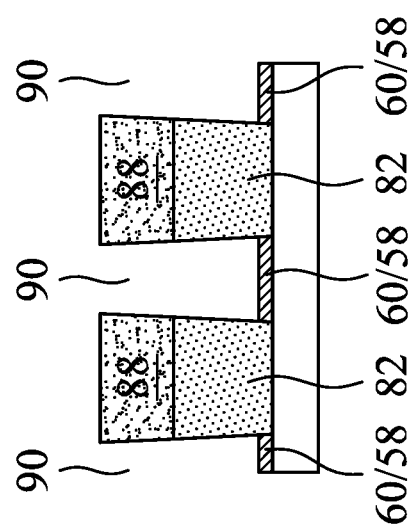
FIG. 14C
FIG. 14D

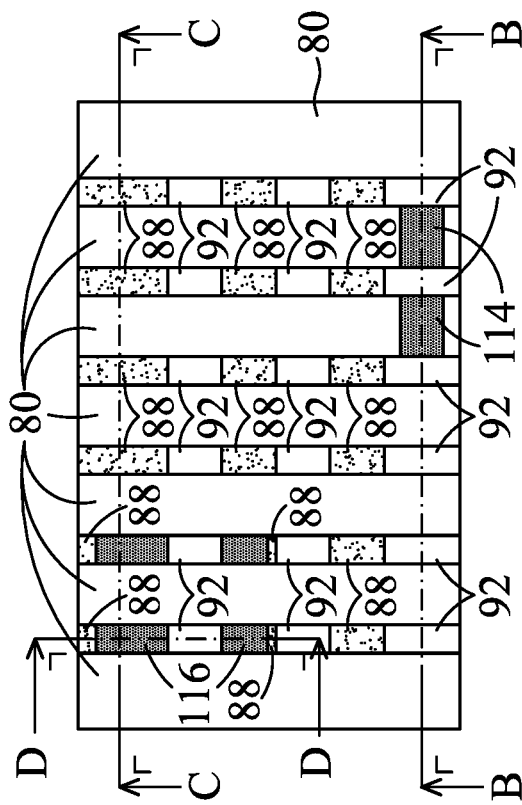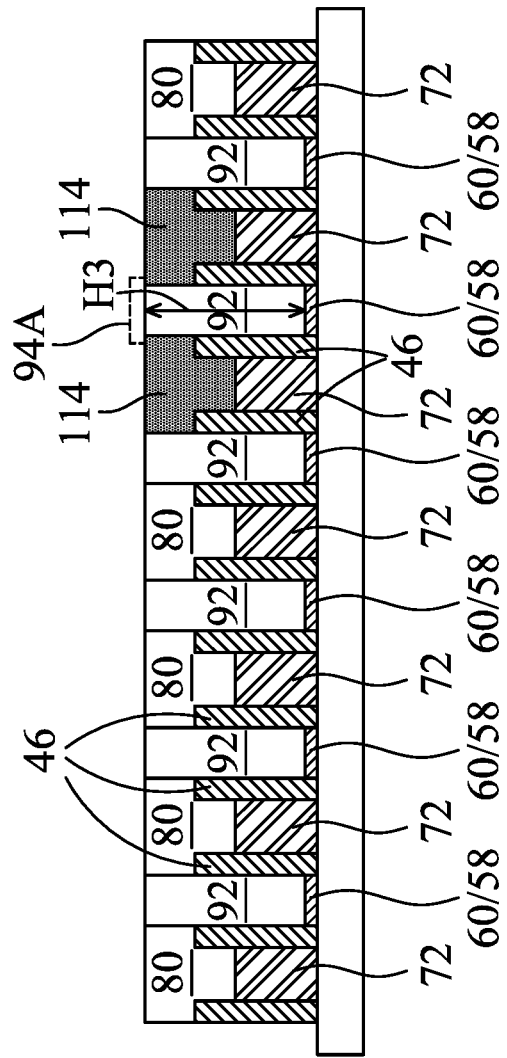

SLOT CONTACTS AND METHOD FORMING SAME

PRIORITY CLAIM AND CROSS-REFERENCE

This application is a continuation of U.S. patent application Ser. No. 17/178,762, entitled "Slot Contacts and Method Forming Same," filed Feb. 18, 2021, which is a divisional of U.S. patent application Ser. No. 16/373,215, entitled, "Slot Contacts and Method Forming Same," filed Apr. 2, 2019, now U.S. Pat. No. 10,943,829 issued Mar. 9, 2021, which claims the benefit of the U.S. Provisional Application No. 62/749,207, filed Oct. 23, 2018, and entitled "Slot Contacts and Method Forming Same," which applications are hereby incorporated herein by reference.

BACKGROUND

In the recent development of transistor manufacturing technology, metal are used for forming contact plugs and metal gates. Contact plugs are used for connecting to the source and drain regions and the gates of transistors. The source/drain contact plugs are typically connected to source/drain silicide regions, which are formed by depositing a metal layer, and then performing an anneal to react the metal layer with the silicon in the source/drain regions. The gate contact plugs are used for connecting to the metal gates.

The formation of metal gates may include forming dummy gate stacks, removing the dummy gate stacks to form openings, filling a metallic material into the openings, and performing a planarization to remove excess metallic material in order to form the metal gates. The metal gates are then recessed to form recesses, and dielectric hard masks are filled into the recesses. When the gate contact plugs are formed, the hard masks are removed, so that the gate contact plugs may contact the metal gates.

Source/drain contact plugs are also formed to electrically couple to the source/drain regions. The formation of the source/drain contact plugs include etching Inter-Layer Dielectric (ILD) to form contact openings, and forming source/drain silicide regions and contact plugs in the contact openings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6, 7A, 7B, 8, 9A, 9B, 10, 11, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, and 21D illustrate the perspective views and cross-sectional views of intermediate stages in the formation of slot source/drain contact plugs and slot gate contact plugs in accordance with some embodiments.

DETAILED DESCRIPTION

Figure 1:
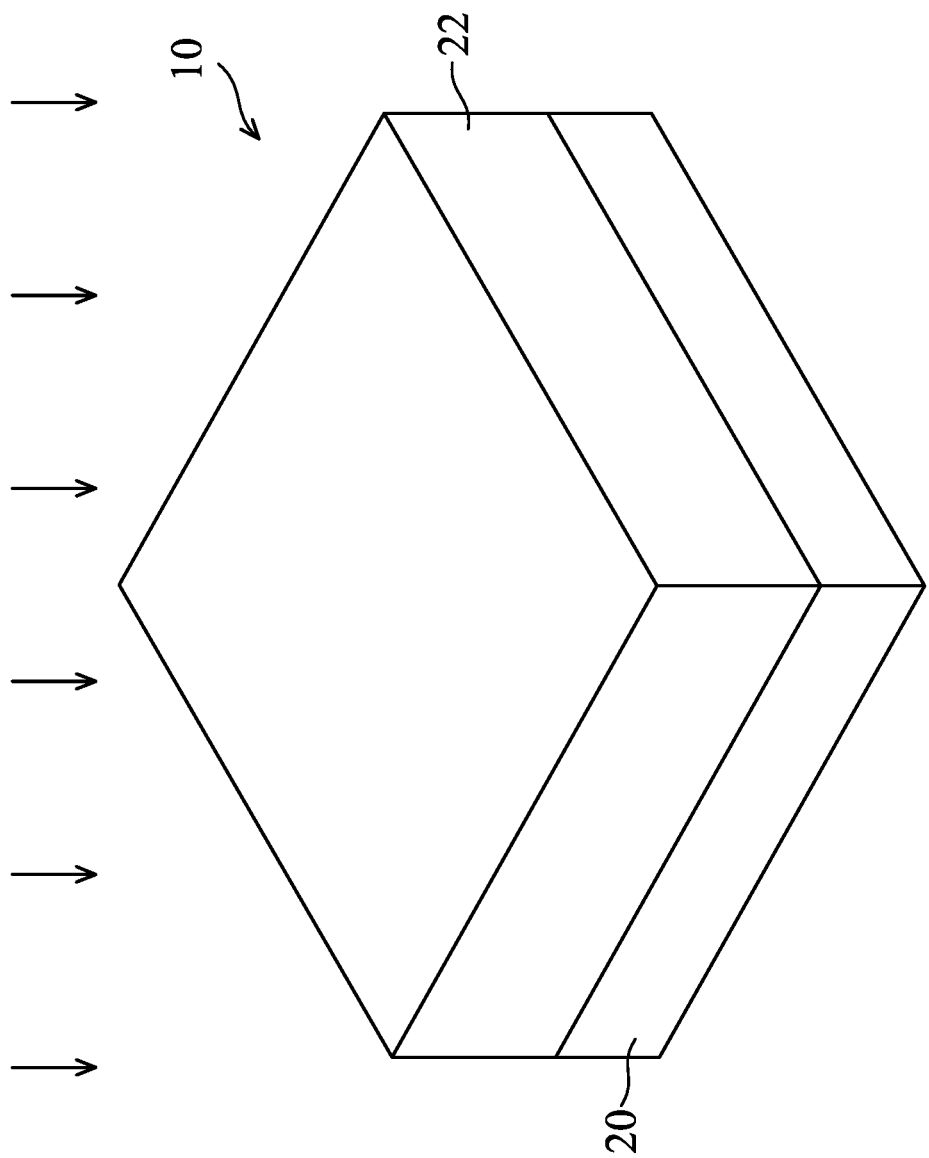

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with slot source/drain contact plugs and slot gate contact plugs and the methods of forming the same are provided in accordance with some embodiments. The intermediate stages of forming the slot source/drain contact plugs and slot gate contact plugs are illustrated in accordance with some embodiments. Some variations of some embodiments are discussed. Throughout the various views and illustrative embodiments, like reference numbers are used to designate like elements. In some illustrated embodiments, the formation of Fin Field-Effect Transistors (FinFETs) is used as an example to explain the concept of the present disclosure. Planar transistors may also adopt the concept of the present disclosure.

Figure 23:
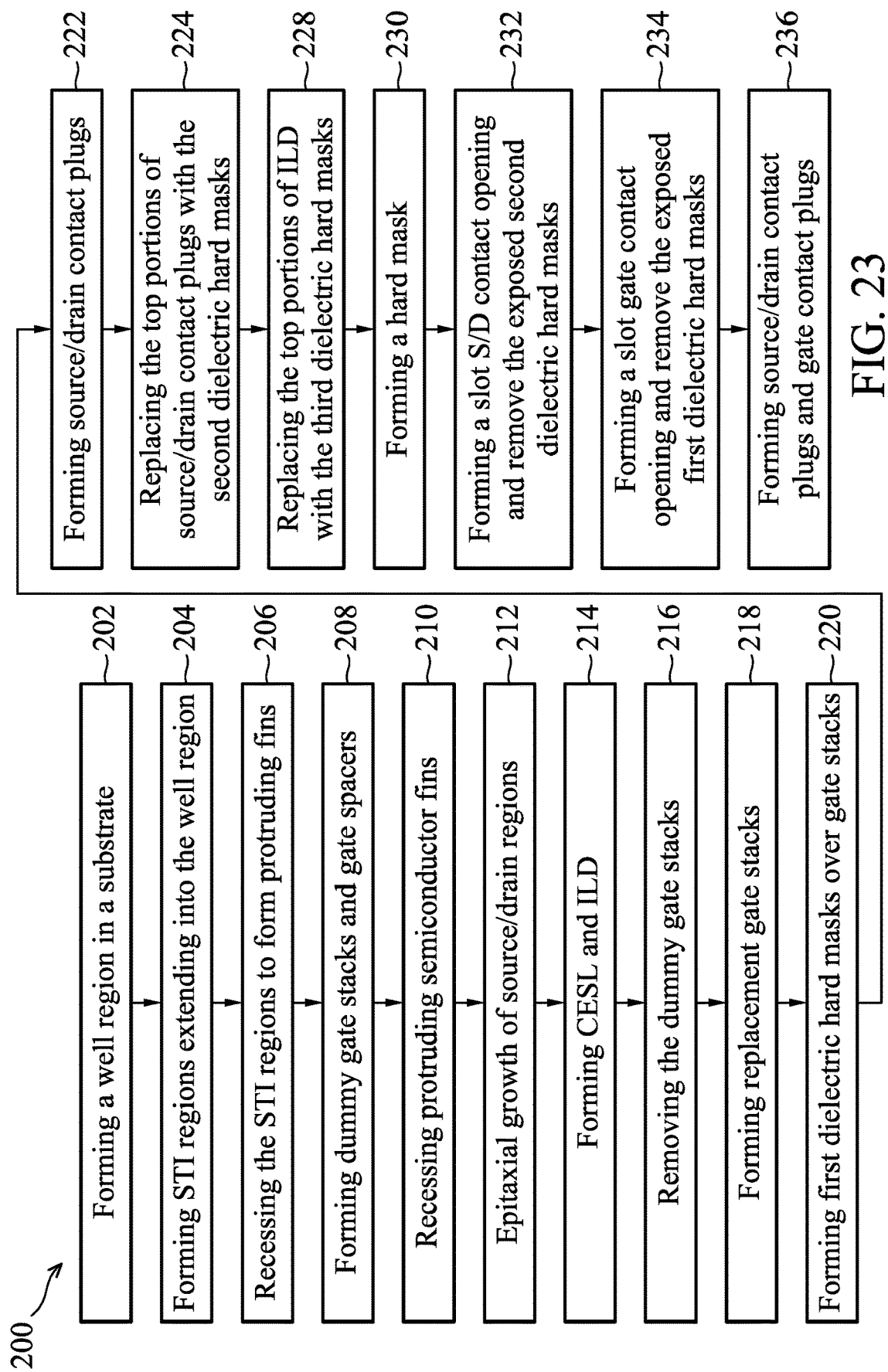
FIG. 23 illustrates a process flow for forming slot source/drain contact plugs and slot gate contact plugs in accordance with some embodiments.

FIGS. 1-6, 7A, 7B, 8, 9A, 9B, 10, 11, 12A, 12B, 12C, 12D, 13A, 13B, 13C, 13D, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, and 21D illustrate the cross-sectional views and perspective views of intermediate stages in the formation of a Fin Field-Effect Transistor (FinFET) and corresponding slot source/drain contact plugs and slot gate contact plugs in accordance with some embodiments of the present disclosure. Throughout the description, a contact plug may also be referred to as a contact, and its top-view shape may include a slot (strip) shape, a rectangular shape, a round shape, or any other applicable shape. The processes shown in these figures are also reflected schematically in the process flow 200 shown in FIG. 23.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 23. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
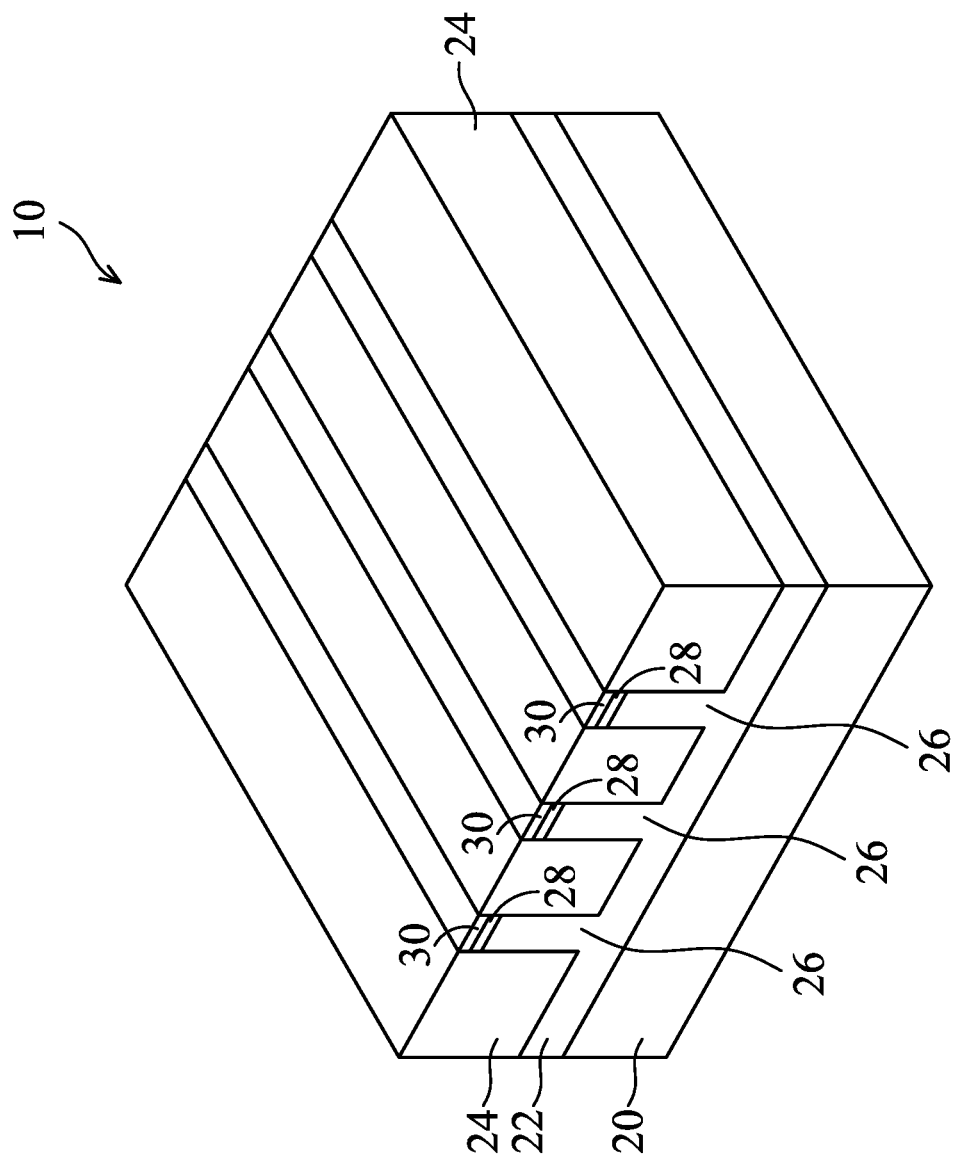

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 23. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
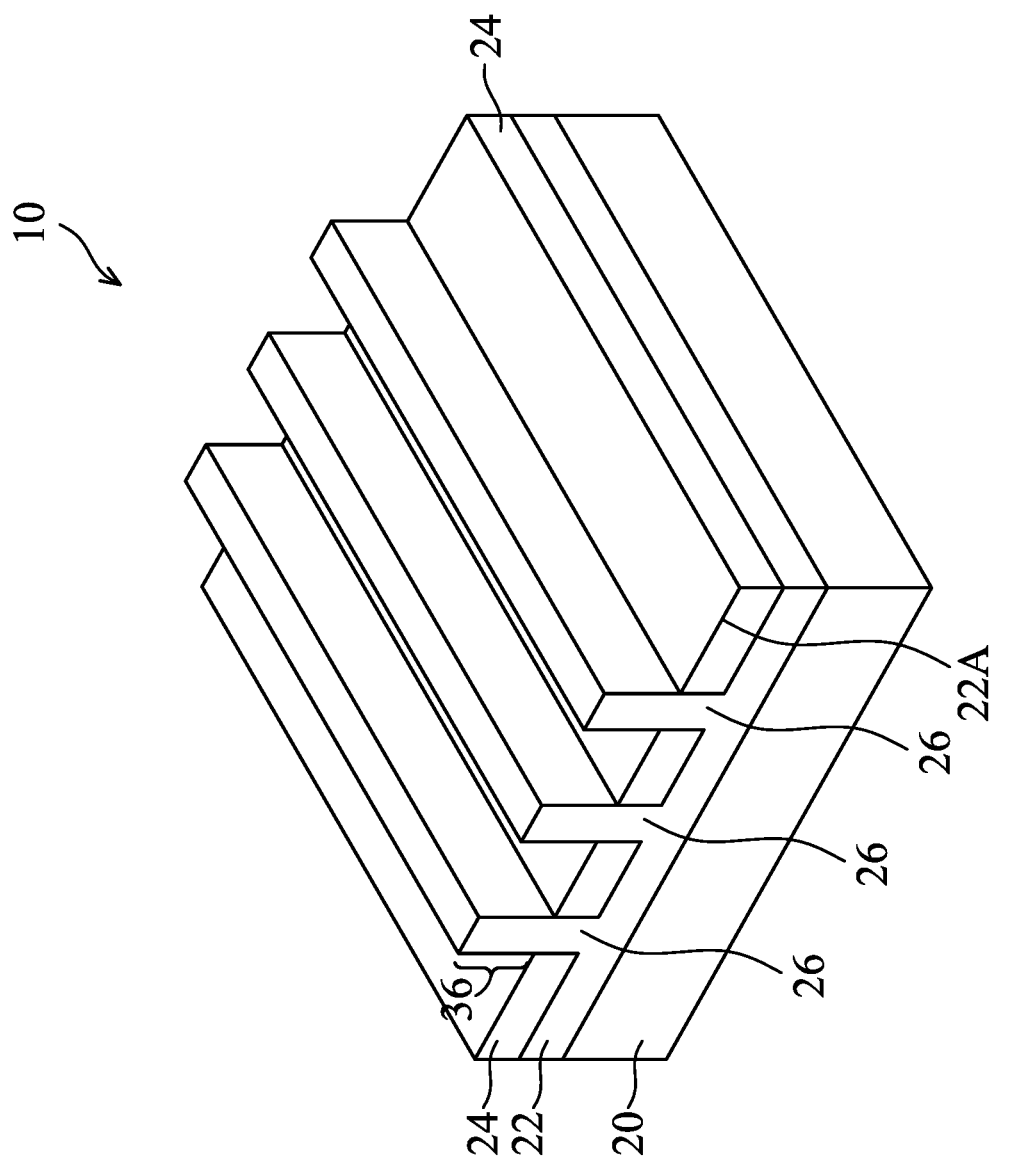

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 23. The etching may be performed using a dry etching process, wherein HF and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
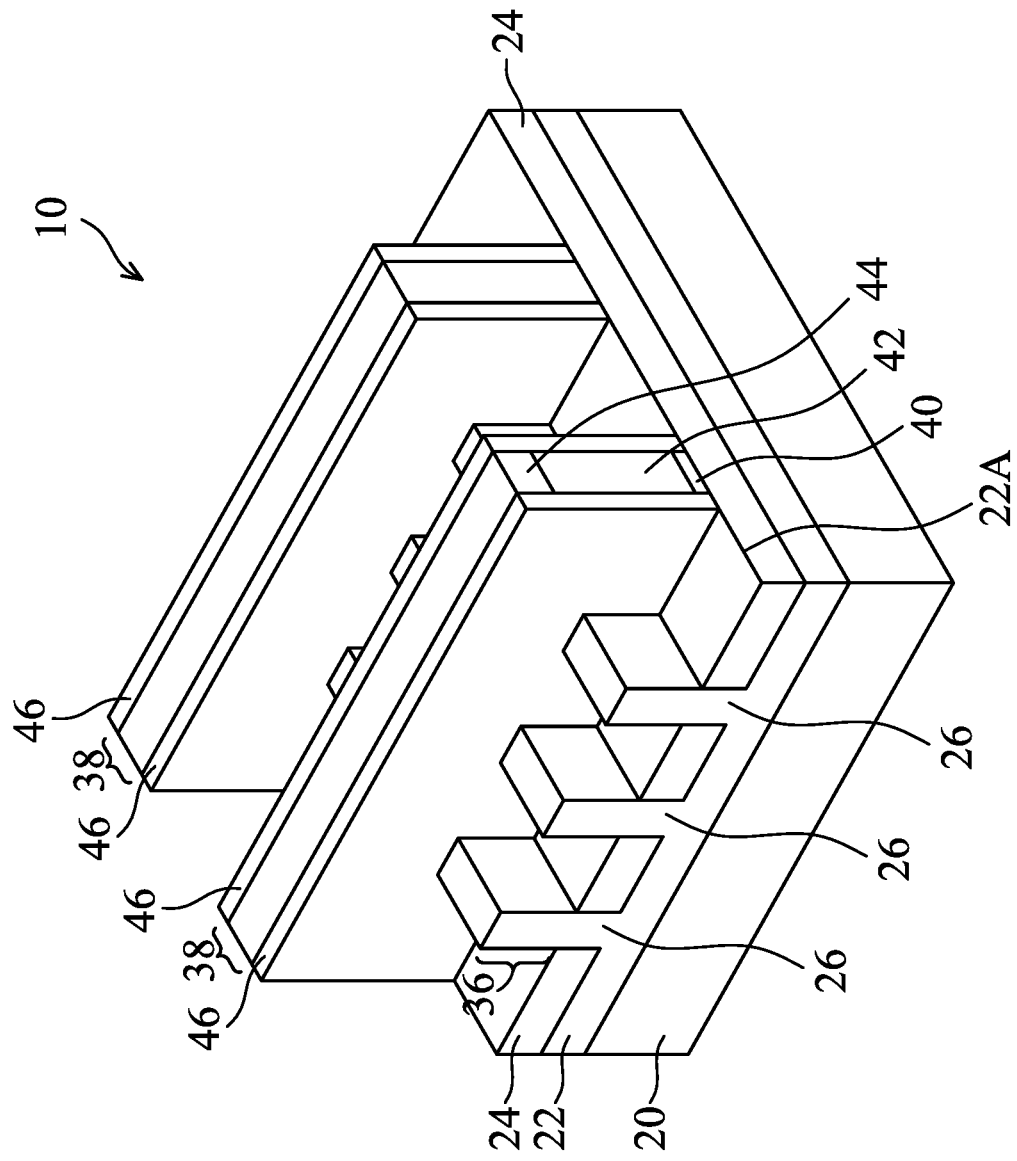

Referring to FIG. 4, dummy gate stacks 38 are formed to extend on the top surfaces and the sidewalls of (protruding) fins 36. The respective process is illustrated as process 208 in the process flow 200 shown in FIG. 23. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24.

Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 23. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
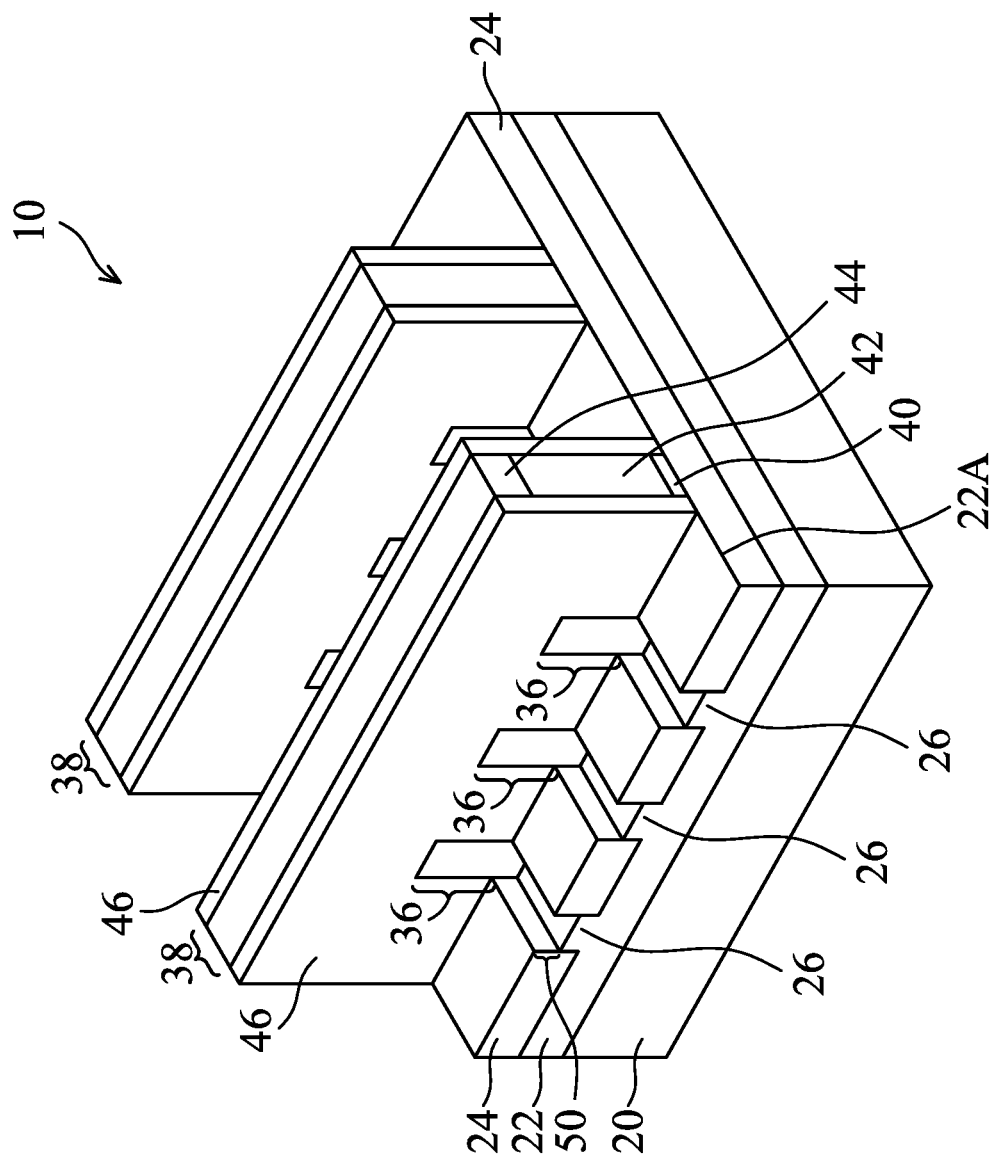

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 23. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
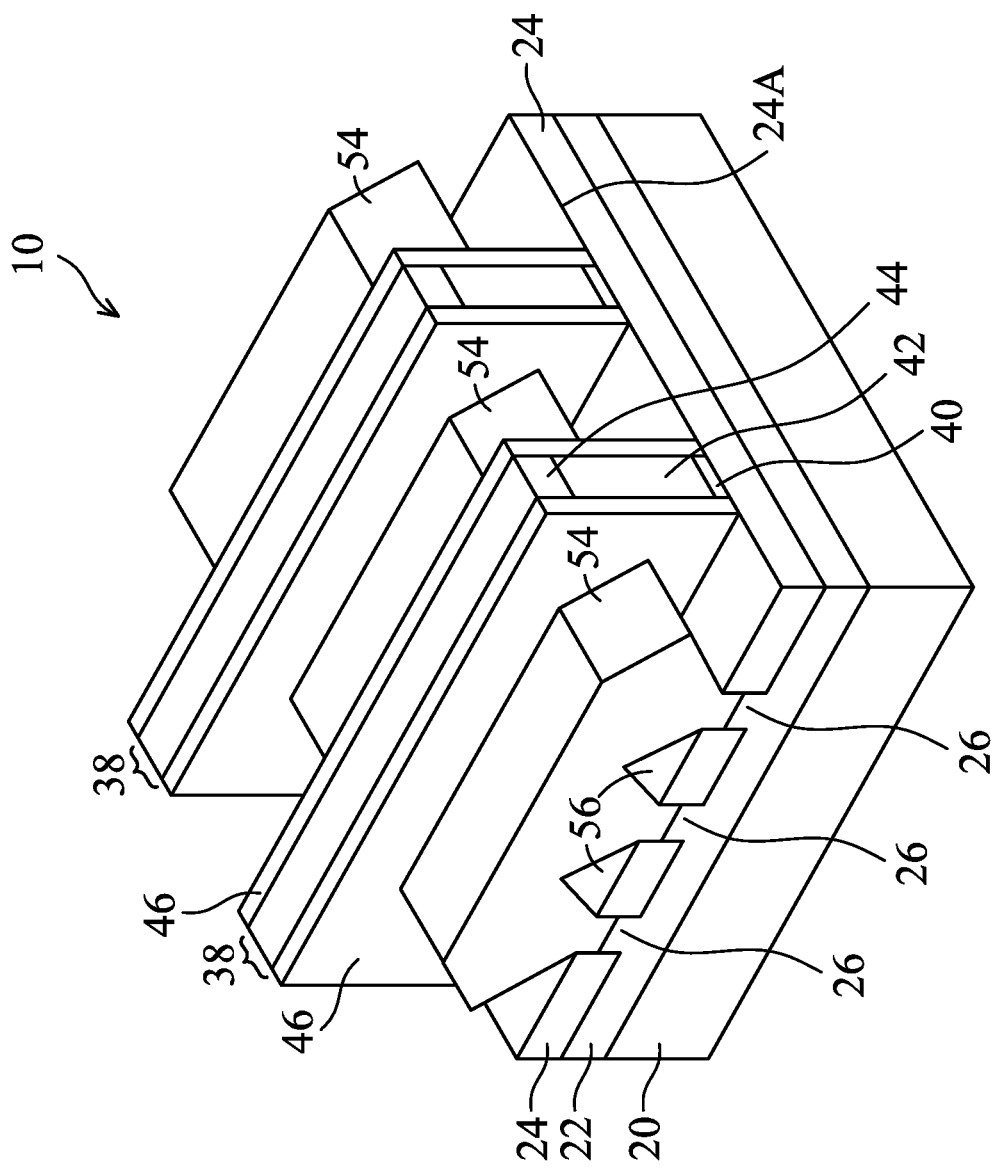

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 23. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, multi-layers thereof, or the like. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become substantially planar, which is achieved by further growing on the epitaxy regions 54 as shown in FIG. 6.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
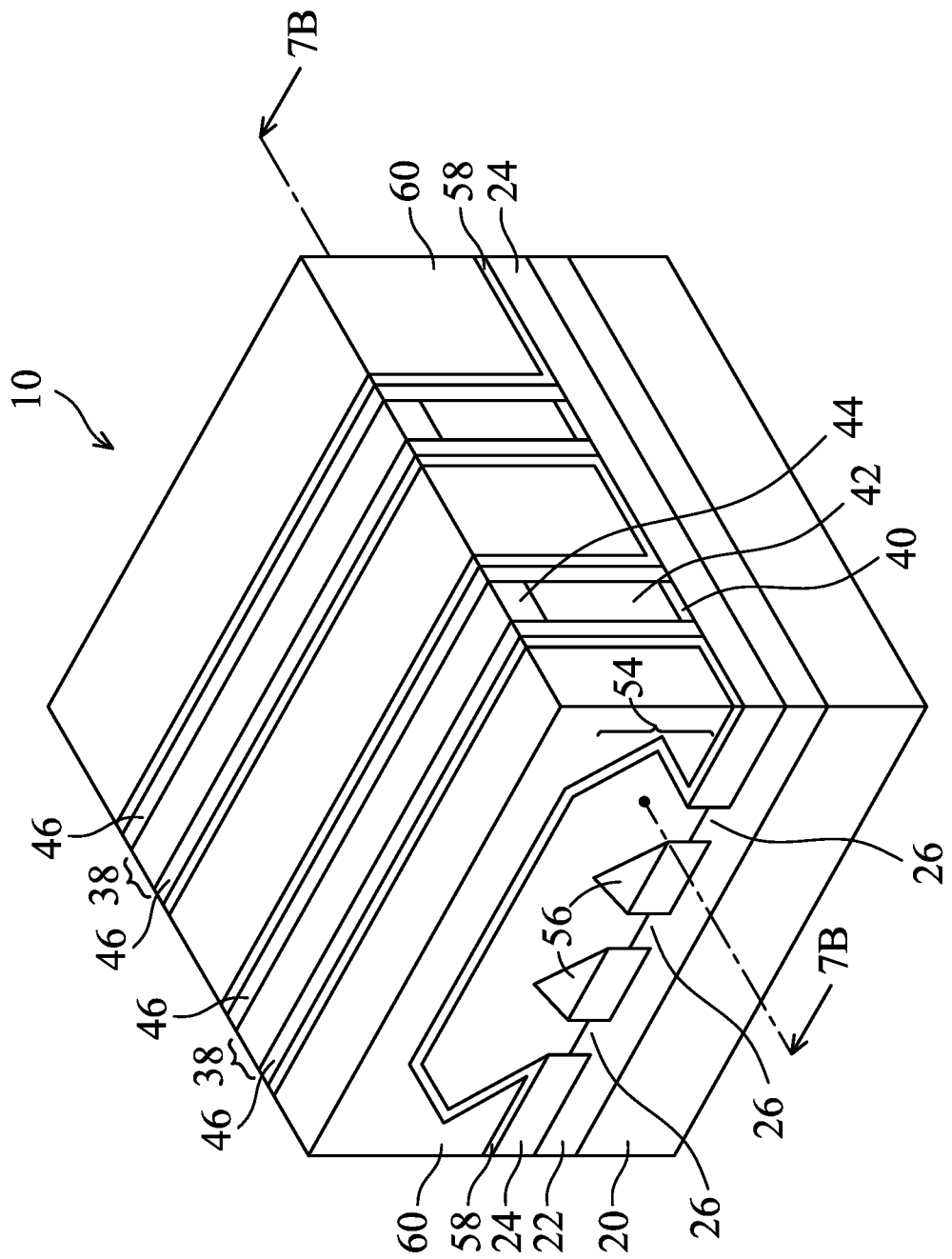

FIG. 7A illustrates a perspective view of the structure after the formation of Contact Etch Stop Layer (CESL) 58 and Inter-Layer Dielectric (ILD) 60. The respective process is illustrated as process 214 in the process flow 200 shown in FIG. 23. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
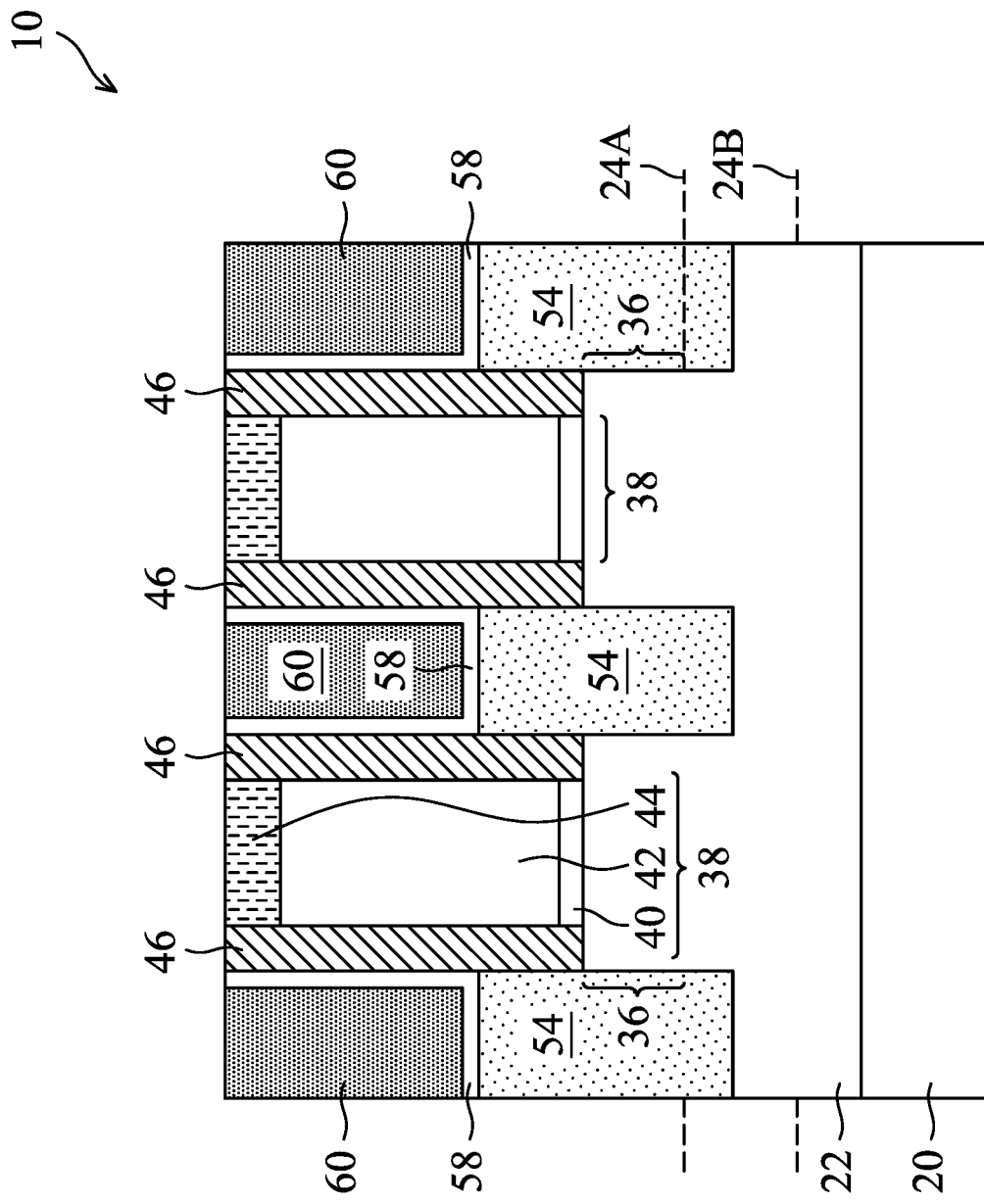
Figure 8:
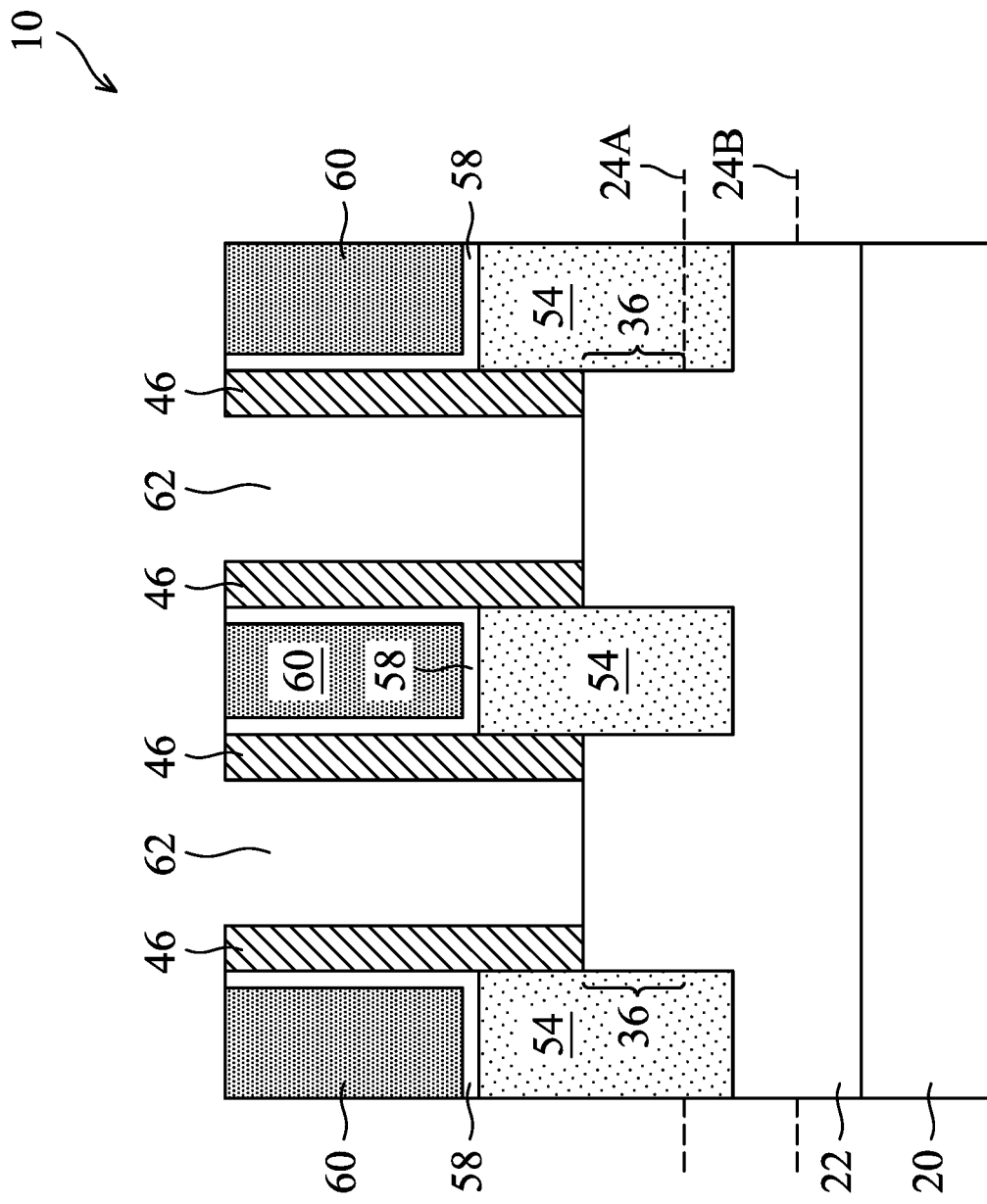

FIG. 7B illustrates the reference cross-section 7B-7B in FIG. 7A, in which dummy gate stacks 38 are illustrated. Next, the dummy gate stacks 38 including hard mask layers 44, dummy gate electrodes 42 and dummy gate dielectrics 40 are etched, forming trenches 62 between gate spacers 46, as shown in FIG. 8. The respective process is illustrated as process 216 in the process flow 200 shown in FIG. 23. The top surfaces and the sidewalls of protruding fins 36 are exposed to trenches 62.

Figure 9A:
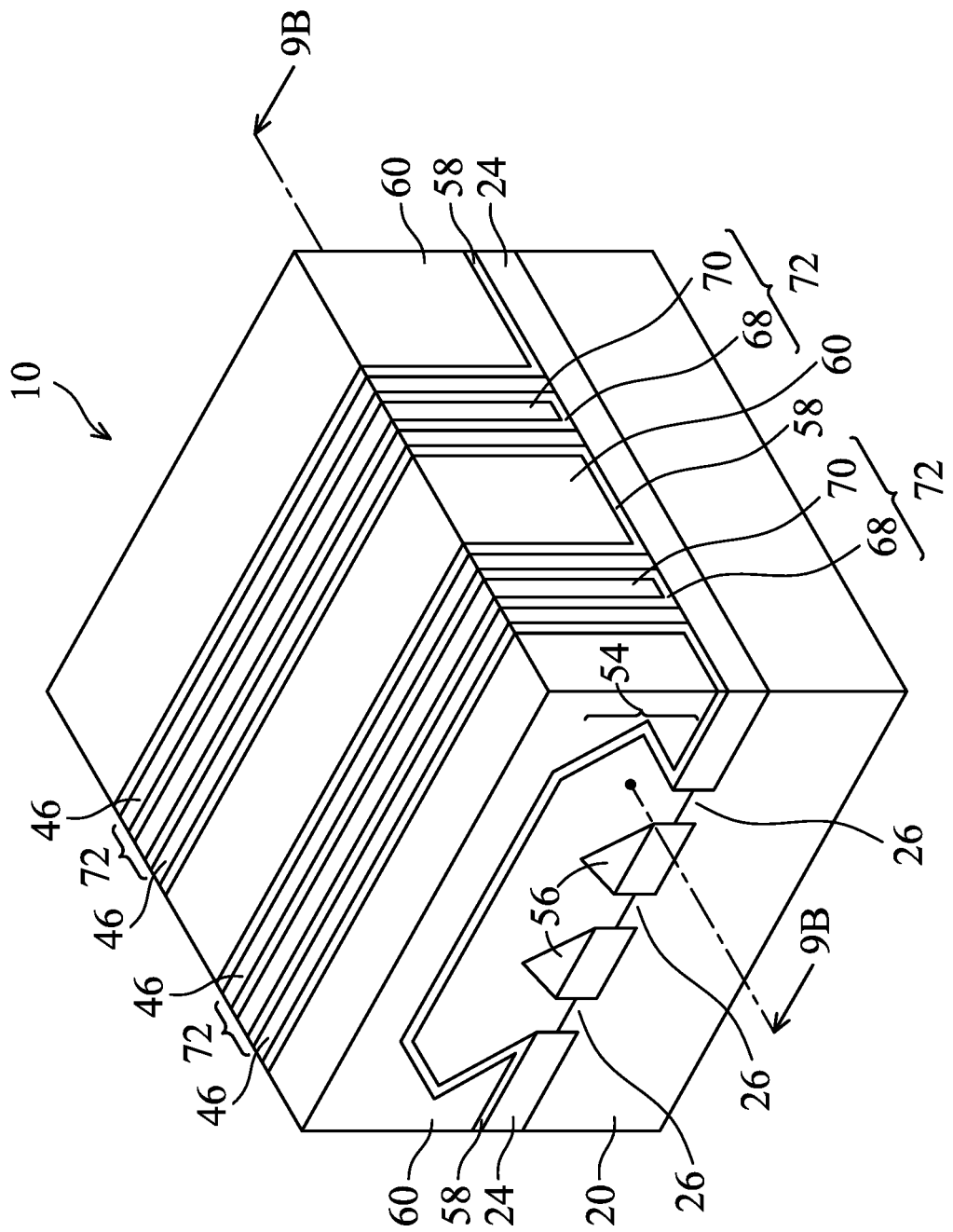
Figure 9B:
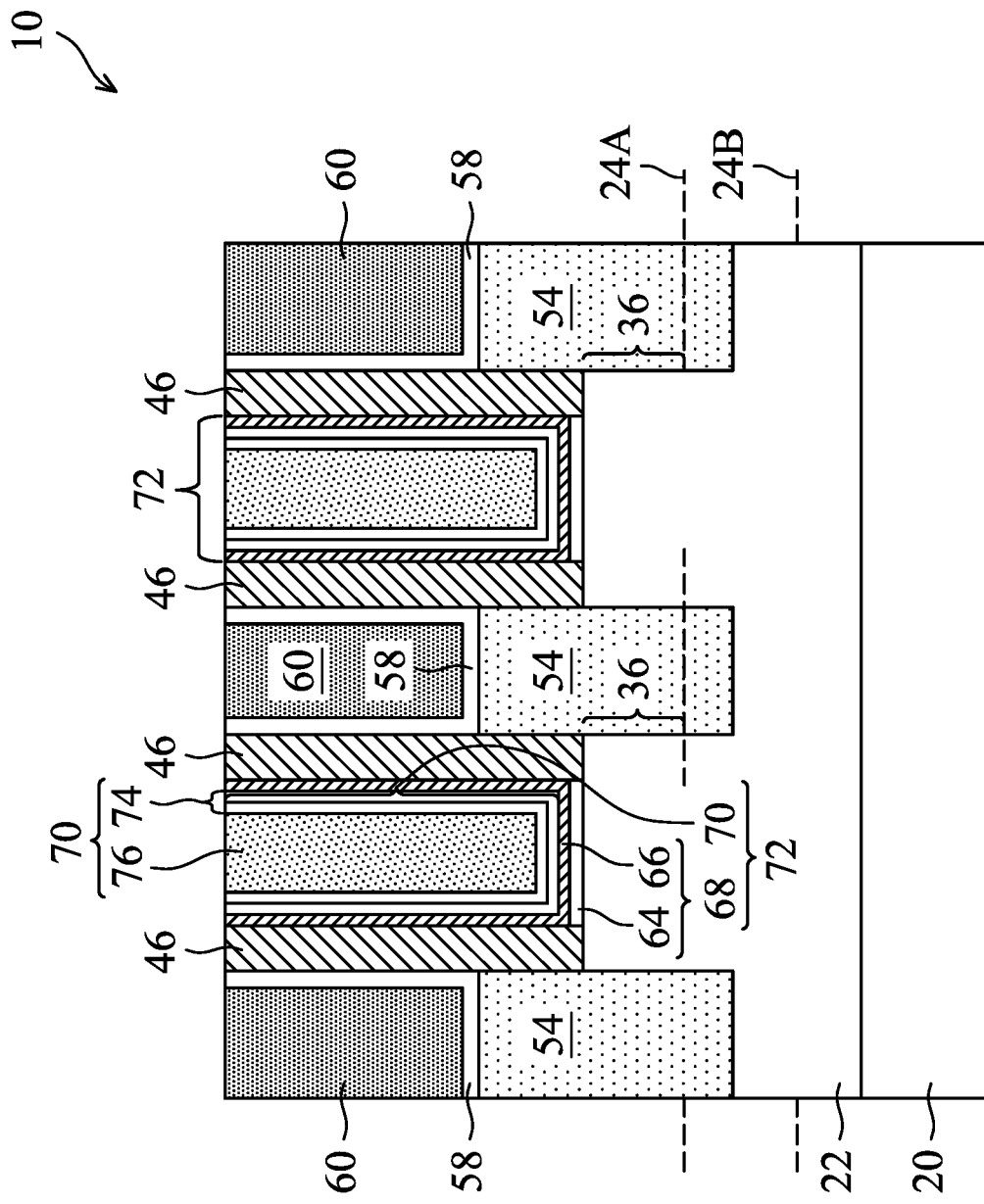

Next, as shown in FIGS. 9A and 9B, replacement gate stacks 72 are formed in trenches 62 (FIG. 8). FIG. 9B illustrates the reference cross-section 9B-9B in FIG. 9A. The respective process is illustrated as process 218 in the process flow 200 shown in FIG. 23. Replacement gate stacks 72 include gate dielectrics 68 and the corresponding gate electrodes 70.

In accordance with some embodiments of the present disclosure, a gate dielectric 68 includes Interfacial Layer (IL) 64 as its lower part. IL 64 is formed on the exposed surfaces of protruding fins 36. IL 64 may include an oxide layer such as a silicon oxide layer, which is formed through the thermal oxidation of protruding fins 36, a chemical oxidation process, or a deposition process. Gate dielectric 68 may also include high-k dielectric layer 66 formed over IL 64. High-k dielectric layer 66 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 66 is overlying, and may contact, IL 64. High-k dielectric layer 66 is formed as a conformal layer, and extends on the sidewalls of protruding fins 36 and the top surface and the sidewalls of gate spacers 46. In accordance with some embodiments of the present disclosure, high-k dielectric layer 66 is formed using ALD, CVD, PECVD, Molecular-Beam Deposition (MBD), or the like.

Further referring to FIG. 9B, gate electrode 70 is formed on gate dielectric 68. Gate electrode 70 may include a plurality of metal-containing layers 74, which may be formed as conformal layers, and filling-metal regions 76 filling the rest of the trenches unfilled by the plurality of metal-containing layers 74. Metal-containing layers 74 may include a barrier layer, a work-function layer over the barrier layer, and one or a plurality of metal capping layers over the work-function layer.

Figure 10:
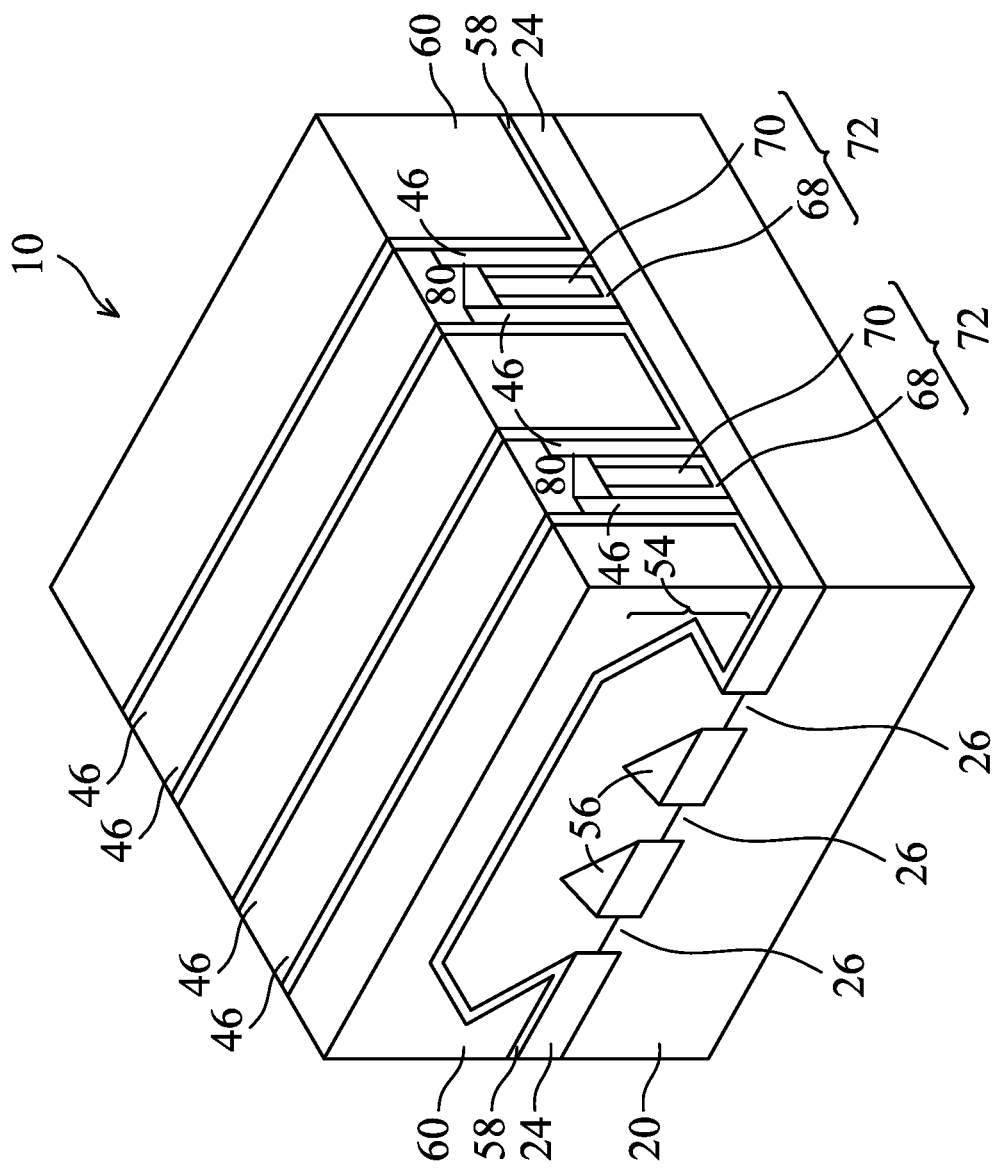

FIG. 10 illustrates the formation of dielectric hard masks 80 in accordance with some embodiments. The respective process is illustrated as process 220 in the process flow 200 shown in FIG. 23. The formation of dielectric hard masks 80 may include performing an etching process to recess gate stacks 72, so that recesses are formed, filling the recesses with a dielectric material, and then performing a planarization process such as a CMP process or a mechanical grinding process to remove excess portions of the dielectric material. Gate spacers 46 may also be recessed in the etching process, and dielectric hard masks 80 may protrude higher than the top surfaces of gate spacers 46. Dielectric hard masks 80 may be formed of silicon nitride, silicon oxynitride, silicon oxy-carbo-nitride, or the like.

Figure 11:
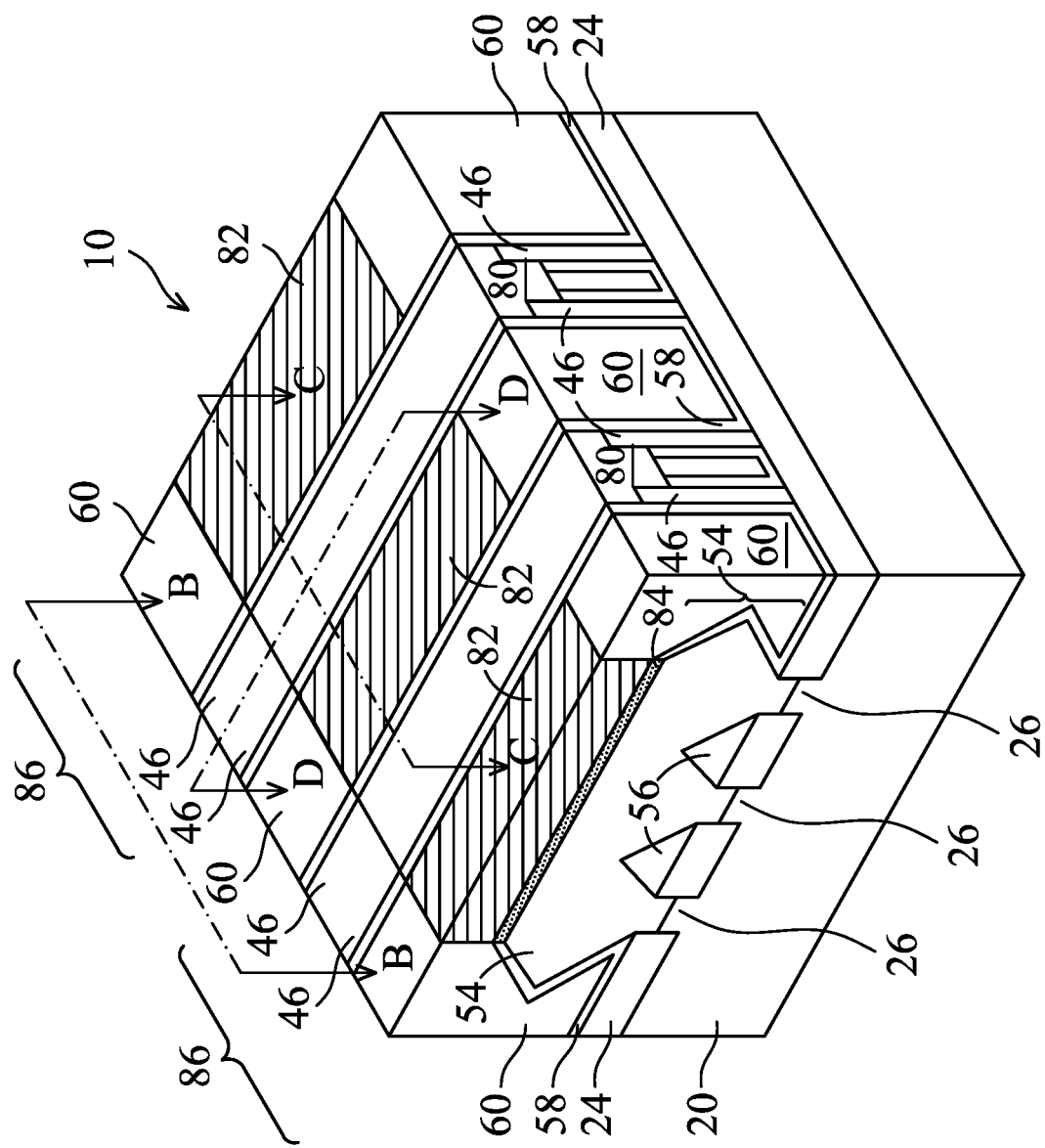

FIG. 11 illustrates the formation of source/drain contact plugs 82. The respective process is illustrated as process 222 in the process flow 200 shown in FIG. 23. The formation of source/drain contact plugs 82 includes etching ILD 60 to expose the underlying portions of CESL 58, and then etching the exposed portions of CESL 58 to reveal source/drain regions 54. In a subsequent process, a metal layer (such as a Ti layer) is deposited and extending into the contact openings. A metal nitride capping layer may be formed. An anneal process is then performed to react the metal layer with the top portion of source/drain regions 54 to form silicide regions 84. Next, either the previously formed metal nitride layer is left without being removed, or the previously formed metal nitride layer is removed, followed by the deposition of a new metal nitride layer (such as a titanium nitride layer). A filling-metallic material such as tungsten, cobalt, or the like, is then filled into the contact openings, followed by a planarization to remove excess materials, resulting in source/drain contact plugs 82. Contact plugs 82 may extend to, and may be in contact with the sidewall portion of CESL 58, or may be spaced apart from the sidewall portions of CESL 58 by some portions of ILD 60. FinFETs 86, which may be connected in parallel as one FinFET, are thus formed.

Contact plugs are then formed over and electrically connected to source/drain contact plugs 82 and the gate electrodes 70 in gate stacks 72. In subsequent figures, the figure numbers (such as 12A, 12B, 12C, and 12D) may include same numbers followed by letter "A," letter "B," letter "C," or letter "D." The letter "A" indicates that the respective figure shows a top view. The letter "B" indicates that the respective figure shows the reference cross-section "B-B" in the respective top view. The letter "C" indicates that the respective figure shows the reference cross-section "C-C" in the respective top view. The letter "D" indicates that the respective figure shows the reference cross-section "D-D" in the respective top view.

Figure 12C:
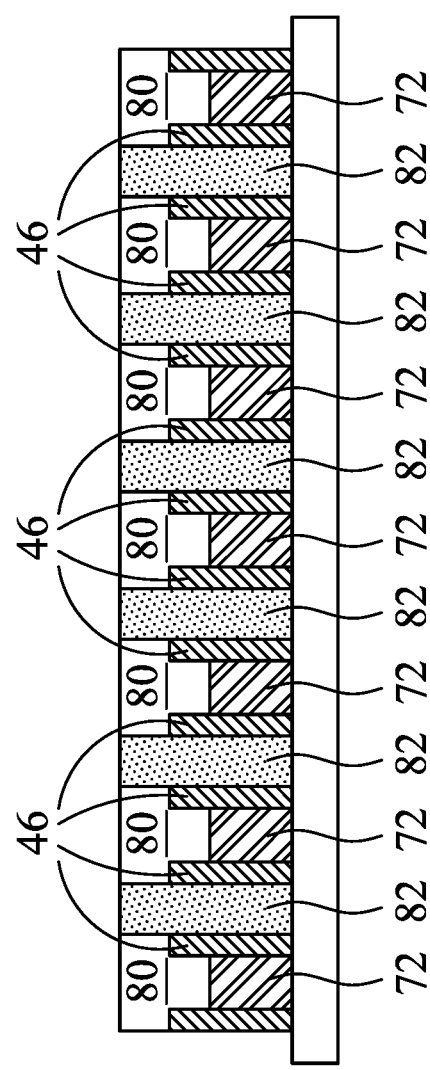

FIG. 12A illustrates a top view of the structure shown in FIG. 11, and FIGS. 12B, 12C, and 12D illustrate the reference cross-sections "B-B," "C-C," and "D-D," respectively, in FIG. 12A. Some details of the structures are not shown in FIGS. 12A, 12B, 12C, 12D, and subsequent figures. For example, in FIGS. 12B, the details of gate stacks 72 are not shown, and in FIGS. 12B, 12C and 12D, the source/drain regions, source/drain silicide regions, semiconductor fins, STI regions, and the like, are not shown. The un-shown details may be found referring to FIGS. 9B and 11, for example.

As shown in FIG. 12A, source/drain contact plugs 82 and ILD 60 may be allocated as a plurality of columns, and allocated alternatingly. It is appreciated that the illustrated layout is an example, and where source/drain contact plugs 82 are formed depends on the circuit design. Dielectric hard masks 80 are formed as strips, with gate stacks 72 (not visible in FIG. 12A, refer to FIG. 12B) underlying hard masks 80. It is appreciated that since the gate stacks may be cut into shorter portions in order to separate the gate electrodes in a same column into smaller pieces, dielectric hard masks 80 in a same column may (or may not) be separated into smaller portions.

Figure 12D:
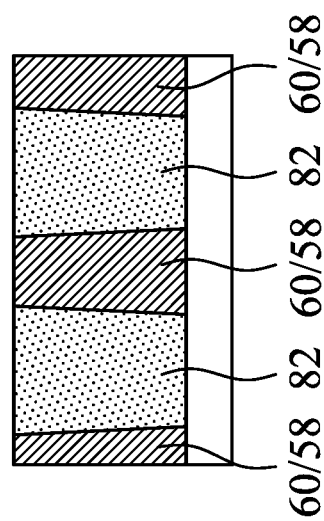

FIG. 12B illustrates reference cross-section B-B in FIG. 12A, and illustrates that a plurality of gate stacks 72 and a plurality of portions of ILD 60 and the underlying CESL 58 are allocated alternatingly. FIG. 12C illustrates reference cross-section C-C in FIG. 12A, and illustrates that a plurality of gate stacks 72 and a plurality of source/drain contact pugs 82 are allocated alternatingly. FIG. 12D illustrates reference cross-section D-D in FIG. 12A, and illustrates two neighboring source/drain contact pugs 82 separated from each other by the ILD 60 and CESL 58 therebetween. Throughout the description, dielectric hard masks 80 are alternatively referred to as Self-Aligned Dielectric-1 (SAD-1). since the sizes and positions of dielectric hard masks 80 are self-aligned to that of gate stacks and gate spacers. The material of SAD-1 may be selected from, and is not limited to, SiC, LaO, AlO, AlON, ZrO, HfO, SiN, ZnO, ZrN, ZrAlO, TiO, TaO, YO, TaCN, ZrSi, SiOCN, SiOC, SiCN, HfSi, SiO, and the like.

Figure 13D:
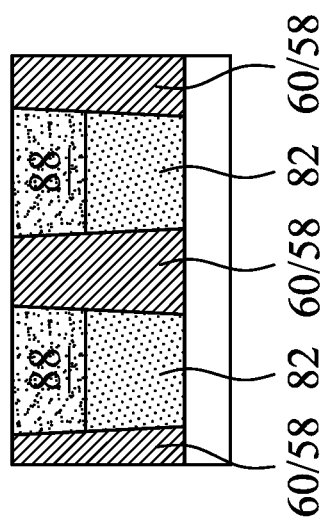
Figure 13C:
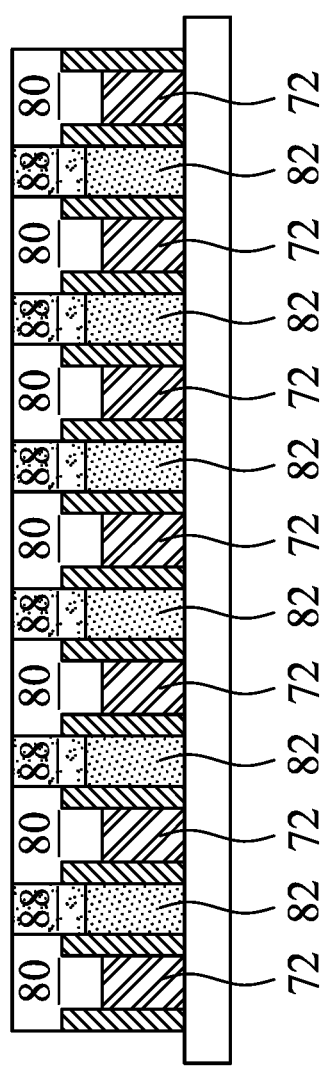
Figure 15A:
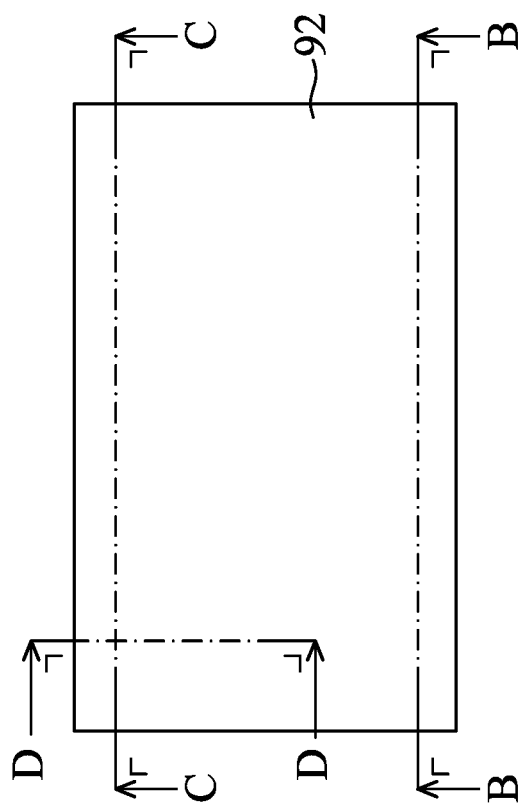
Figure 15B:
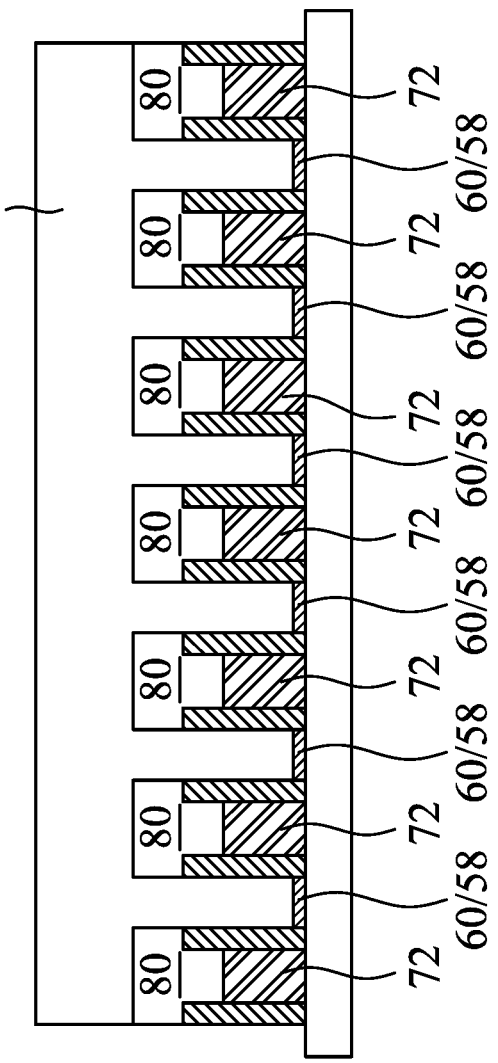
Figure 15D:
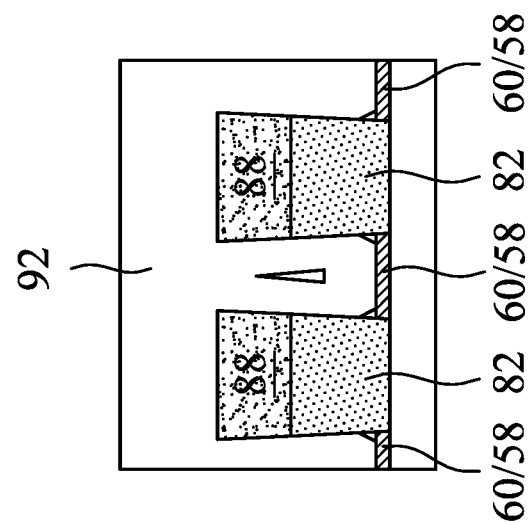
Figure 15C:
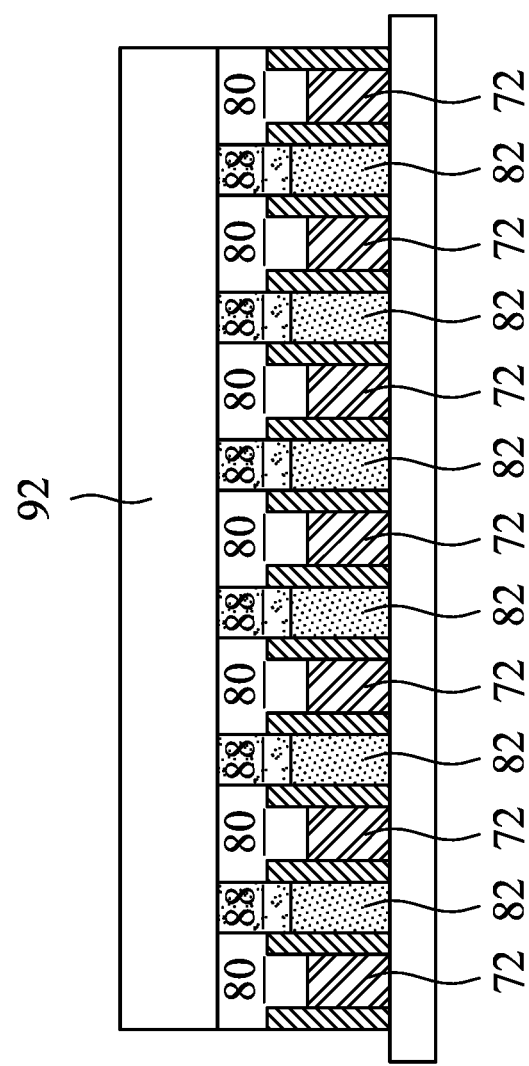

Referring to FIGS. 13A, 13C, and 13D, dielectric hard masks 88 are formed. The respective process is illustrated as process 224 in the process flow 200 shown in FIG. 23. Dielectric hard masks 88 are referred to as SAD-2 since they are self-aligned to source/drain contact plugs 82, and are between dielectric hard masks 80. The material of dielectric hard masks 88 is different from that of ILD 60, and may be selected from, and is not limited to, SiC, LaO, AlO, AlON, ZrO, HfO, SiN, ZnO, ZrN, ZrAlO, TiO, TaO, YO, TaCN, ZrSi, SiOCN, SiOC, SiCN, HfSi, SiO, and the like. Also, the material of dielectric hard masks 88 may be the same as or different from the material of dielectric hard masks 80. The formation of dielectric hard masks 88 may include etching source/drain contact plugs 82 as shown in FIGS. 12A, 12C and 12D to form recesses, filling a dielectric material into the recesses, and performing a planarization process such as a CMP process or a mechanical grinding process. The bottoms of dielectric hard masks 88 may be lower than, level with, or higher than the top surfaces of gate spacers 46. Dielectric hard masks 88 may not extend into, and hence are not shown in, the reference cross-section in FIG. 13B.

FIGS. 14A, 14B, 14C, 14D, 15A, 15B, 15C, 15D, 16A, 16B, 16C, and 16D illustrate the formation of dielectric hard masks 92, which are alternatively referred to as SAD-3. The respective process is illustrated as process 228 in the process flow 200 shown in FIG. 23. Referring to FIGS. 14B and 14D, ILD 60 is recessed in an etching process, forming openings 90. As shown in FIG. 14A, the positions and the sizes of recesses 90 may be the same as the positions and the sizes, respectively, of ILD 60 and CESL 58. After the recessing, a portion of ILD 60 and CESL 58 is left under each opening 90, with the CESL 58 have a U-shape cross-sectional view (refer to FIG. 11). The bottoms of openings 90 may be lower than, level with, or higher than the interface (shown in FIGS. 14C and 14D) between source/drain contact plugs 82 and dielectric hard masks 88. The etching is performed using an etching gas that has a high etching selectivity relative to dielectric hard masks 80 and 88, so that dielectric hard masks 80 and 88 are not etched. Furthermore, gate spacers 46 are not damaged.

FIGS. 15A, 15B, 15C, and 15D illustrate the formation of dielectric material 92. Dielectric material 92 may be selected from the materials that have high breakdown voltage such as high-k dielectric materials. Dielectric material 92 may include, and is not limited to, SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, or the like. Furthermore, although dielectric material 92 may have common candidate materials as dielectric hard masks 80 and 88, the material of dielectric material 92 is different from the materials of both dielectric hard masks 80 and 88, so that in the subsequent etching process, there are high etching selectivity values.

The formation method of dielectric material 92 may include Atomic Layer Deposition (ALD), spin-on coating, PECVD, or the like.

Figure 16A:
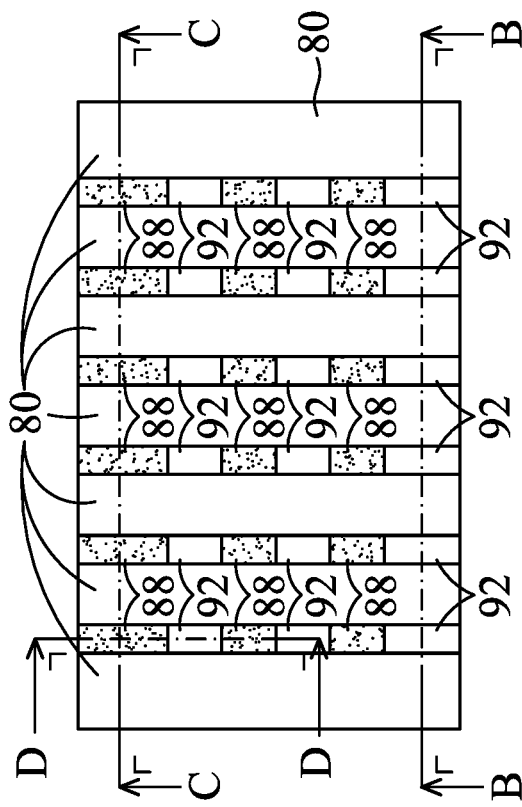
Figure 16B:
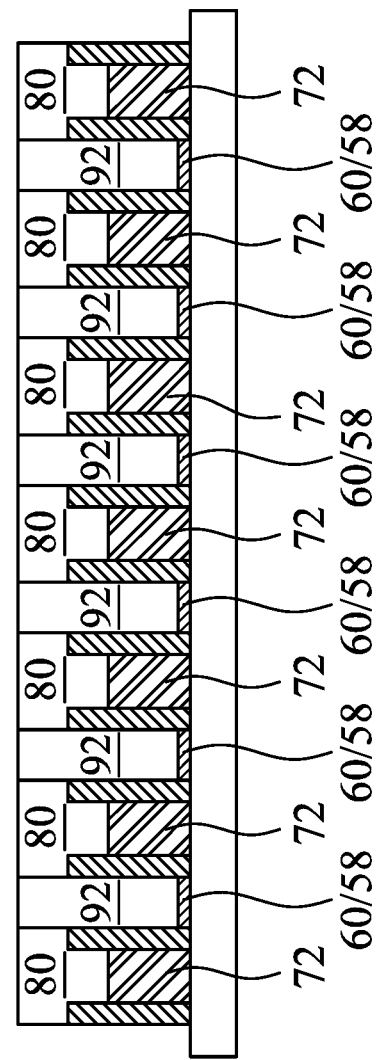
Figure 16D:
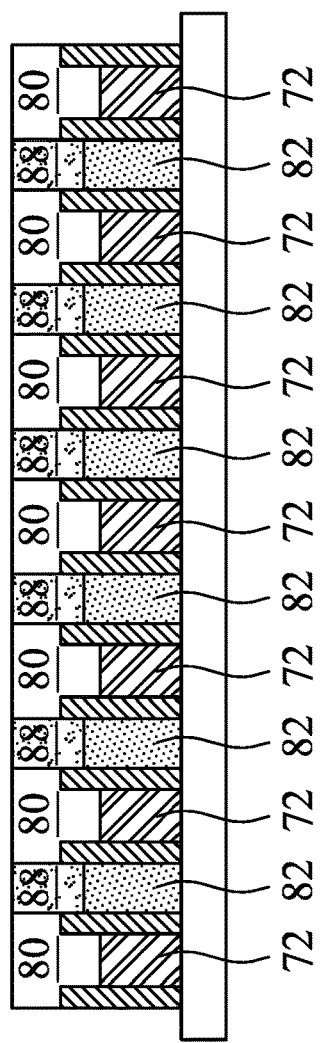
Figure 16C:
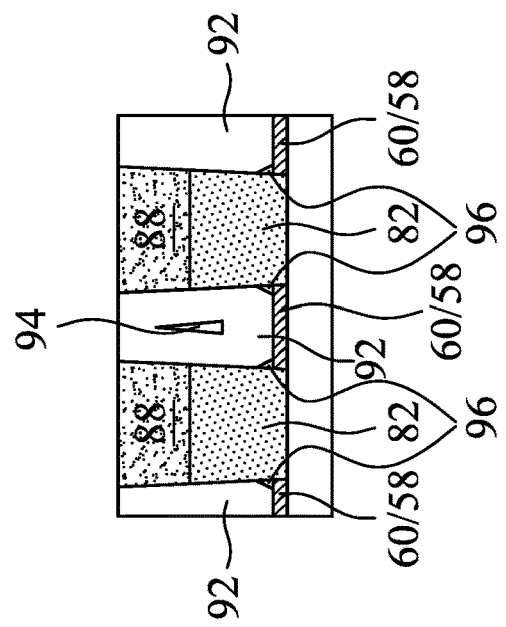
Figure 17A:
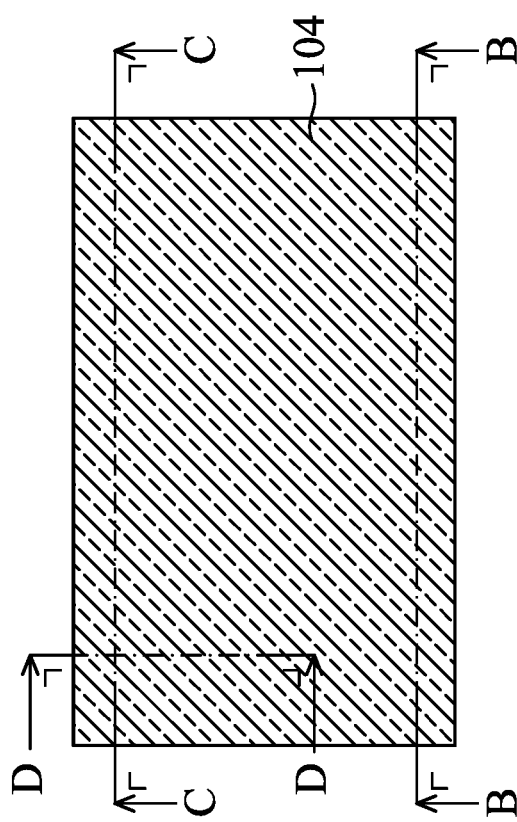
Figure 17B:
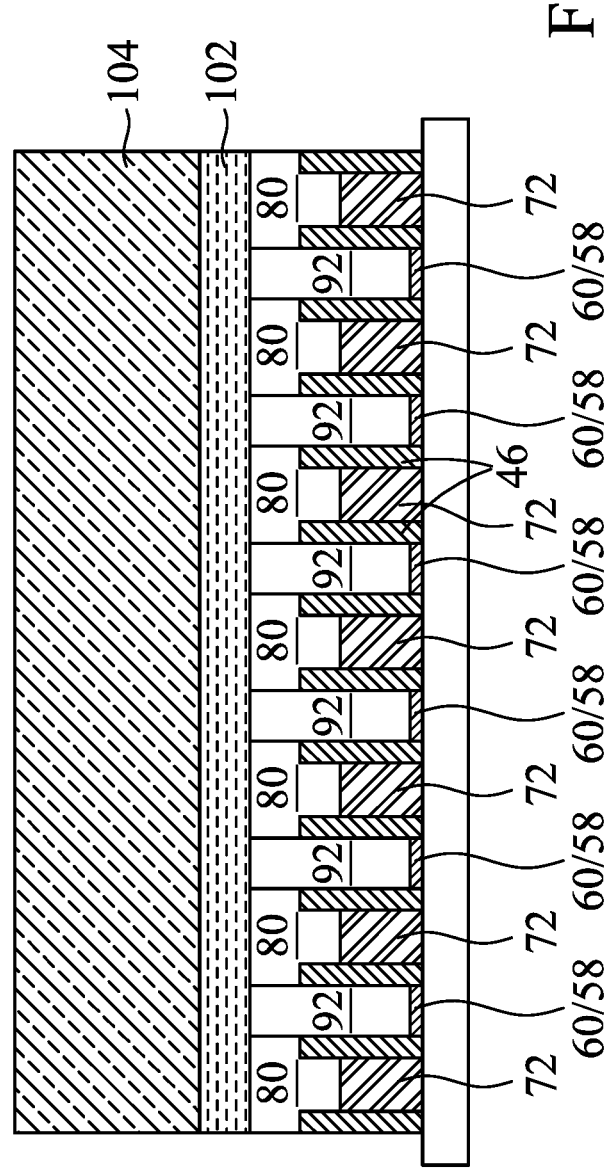
Figure 17D:
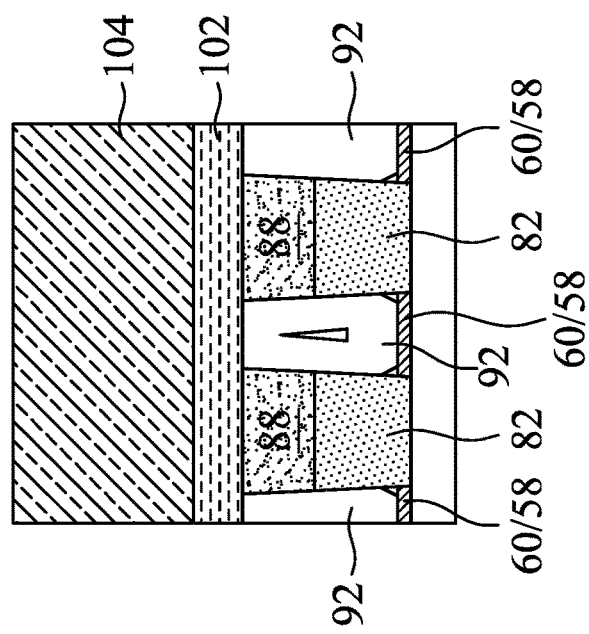
Figure 17C:
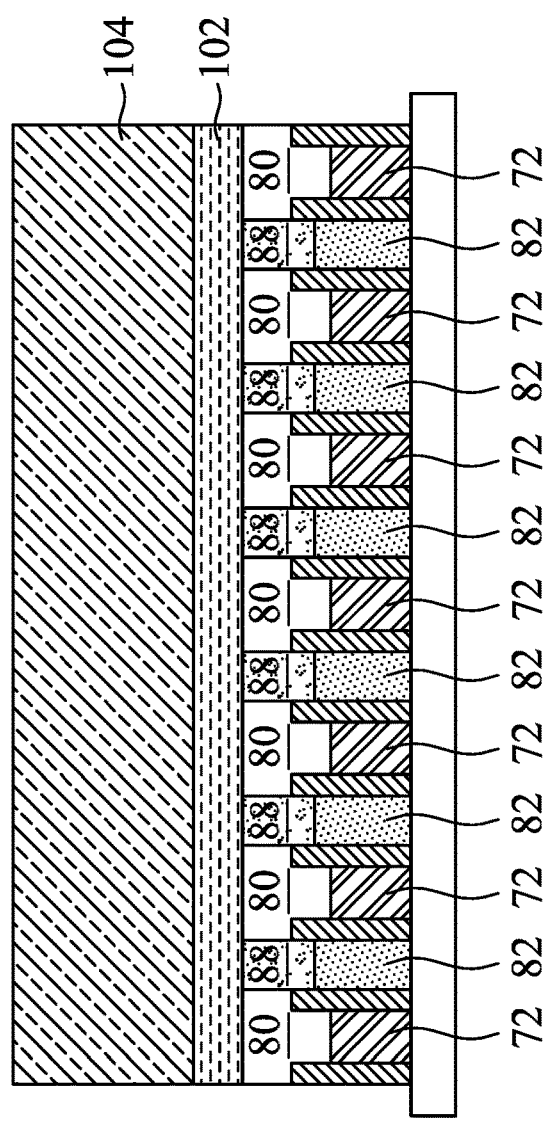

In accordance with some embodiments of the present disclosure, dielectric material 92 is planarized if its top surface is not planar. Otherwise, the planarization process may be skipped. An etch-back process is then performed until the top surface of the remaining dielectric material 92 is coplanar with the top surface of dielectric hard masks 80 (FIG. 16B) and dielectric hard mask 88 (FIG. 16C). In accordance with some embodiments of the present disclosure, the planarization process is performed until both dielectric hard masks 80 and 88 are exposed. The remaining portions of dielectric material 92 are also referred to as dielectric hard masks 92 or SAD-3 92. FIGS. 16A and 16D illustrate the top view and a cross-sectional view, respectively. At this time, the top surfaces of dielectric hard masks 80, 88, and 92 are all exposed, and may be coplanar.

As shown in FIG. 16D, air gap 94 may be formed, which is sealed in the corresponding dielectric hard mask 92. In addition, since dielectric hard masks 92 may have top widths smaller than the bottom widths, there may be voids 96 formed at the bottom corners, which are the corner regions defined by source/drain contact plugs 82, CESL/ILD 58/60, and dielectric hard masks 92. If viewed in the top view, air gap 94 and voids 96 may form elongated strips having lengthwise directions parallel to the lengthwise direction of hard masks 92. In accordance with alternative embodiments, either one or both of air gap 94 and voids 96 is not formed.

FIGS. 17A, 17B, 17C, and 17D illustrate the formation of etch stop layer 102 and hard mask 104, which are used for forming and preserving the patterns of slot gate contact openings and slot source/drain contact openings. The respective process is illustrated as process 230 in the process flow 200 shown in FIG. 23. Etch stop layer 102 may be formed of an oxide, a nitride, a carbide, an oxycarbide, or the like. Hard mask 104 may be formed of titanium nitride, boron nitride, oxide, nitride, or the like.

Figure 18A:
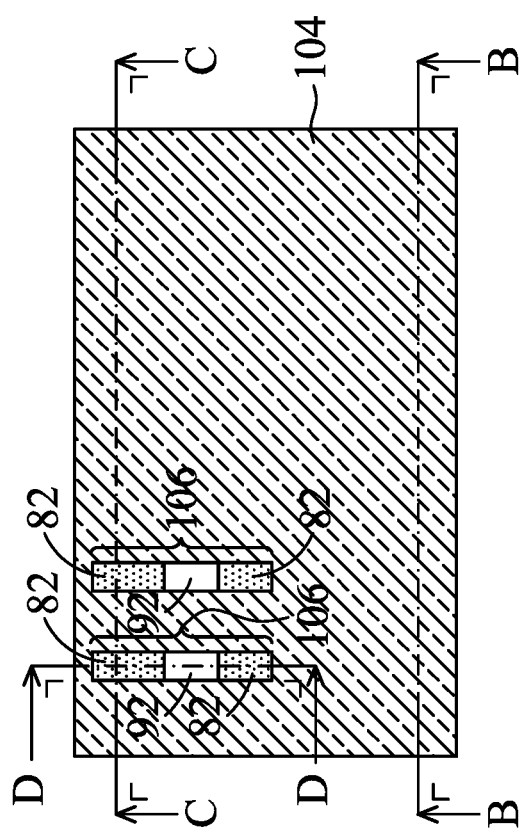
Figure 18B:
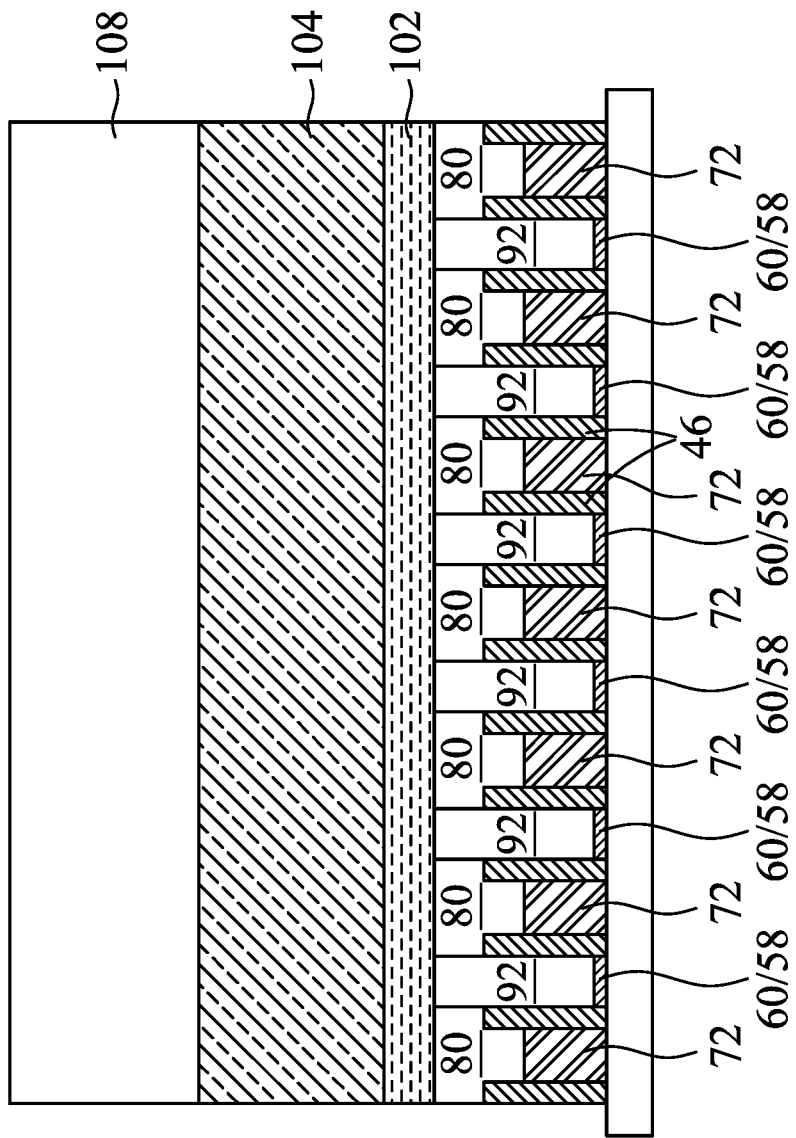

Next, as shown in FIGS. 18A, 18B, 18C, and 18D, slot source/drain contact openings are formed. The respective process is illustrated as process 232 in the process flow 200 shown in FIG. 23. Some parts of hard mask 104 and etch stop layer 102 are etched, so that openings 106 (FIGS. 18A, 18C and 18D) are formed in hard mask 104 and etch stop layer 102. FIG. 18A illustrates an example, in which slot-shaped (elongated) openings 106 are formed, through which the underlying dielectric hard masks 88 and 92 are exposed. In accordance with some embodiments of the present disclosure, to form openings 106, photo resist 108 (FIGS. 18B, 18C, and 18D) is formed and patterned, and then hard mask 104 and etch stop layer 102 are etched using the patterned photo resist 108 as an etching mask.

Figure 18D:
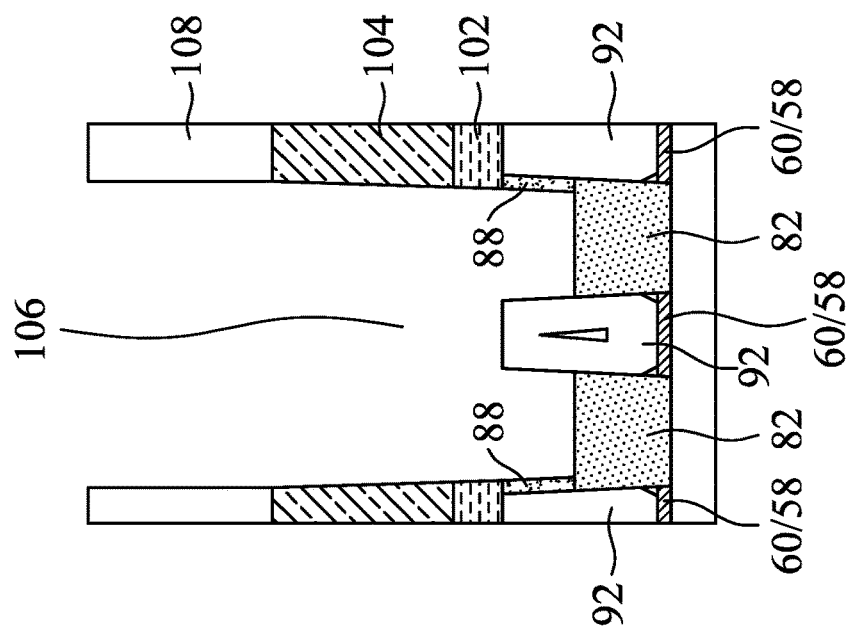
Figure 18C:
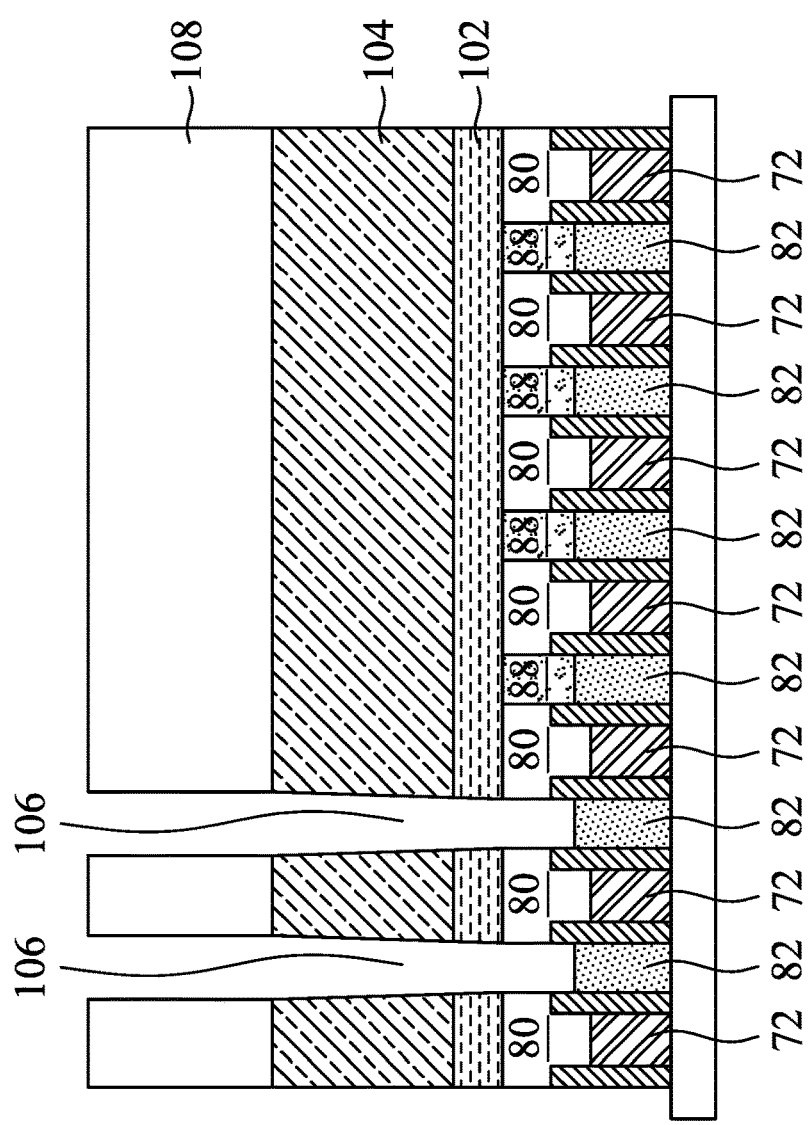

Next, as shown in FIGS. 18C and 18D, the portions of exposed dielectric hard masks 88 are etched to extend slot openings 106 between dielectric hard masks 80. The respective process is also illustrated as process 232 in the process flow 200 shown in FIG. 23. Slot openings 106 thus have portions extending down to a level lower than the top surfaces of the third dielectric hard masks 92 (FIG. 18D), and the respective portions are referred to as slot opening extensions hereinafter. Some source/drain contact plugs 82 are exposed, as shown in FIGS. 18C and 18D. Also, as shown in FIG. 18D, dielectric hard mask 92 remains. The etching of dielectric hard masks 88 is performed using an etchant, so that there is a high etching selectivity value (the ratio of the etching rate of dielectric hard masks 88 to the etching rate of dielectric hard masks 92), for example, higher than about 20, 30, or higher. As a result, as shown in FIG. 18D, dielectric hard mask 92 is not etched, and is left to separate the neighboring slot opening extensions from each other. Furthermore, in the etching, the etching selectivity (the etching rate of dielectric hard masks 88 to the etching rate of dielectric hard masks 80) may range between about 1.0 and about 50, for example. Photo resist 108 is then removed.

Figure 19A:
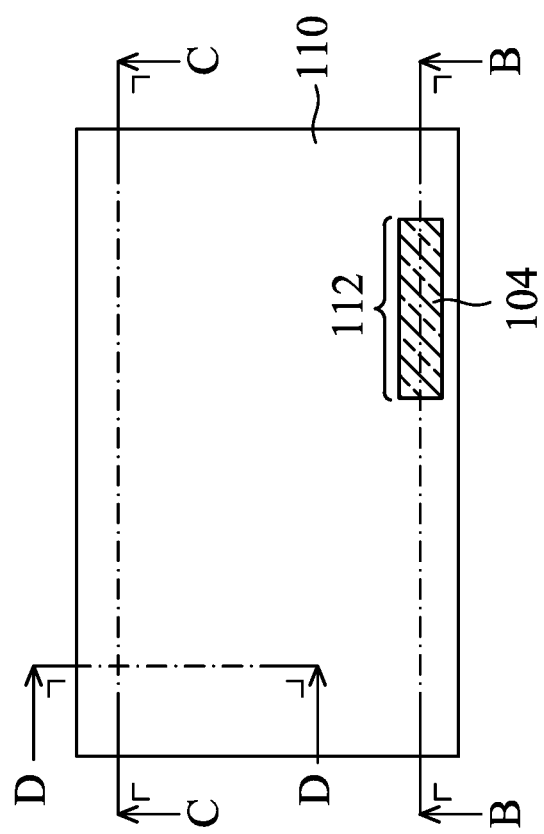
Figure 19B:
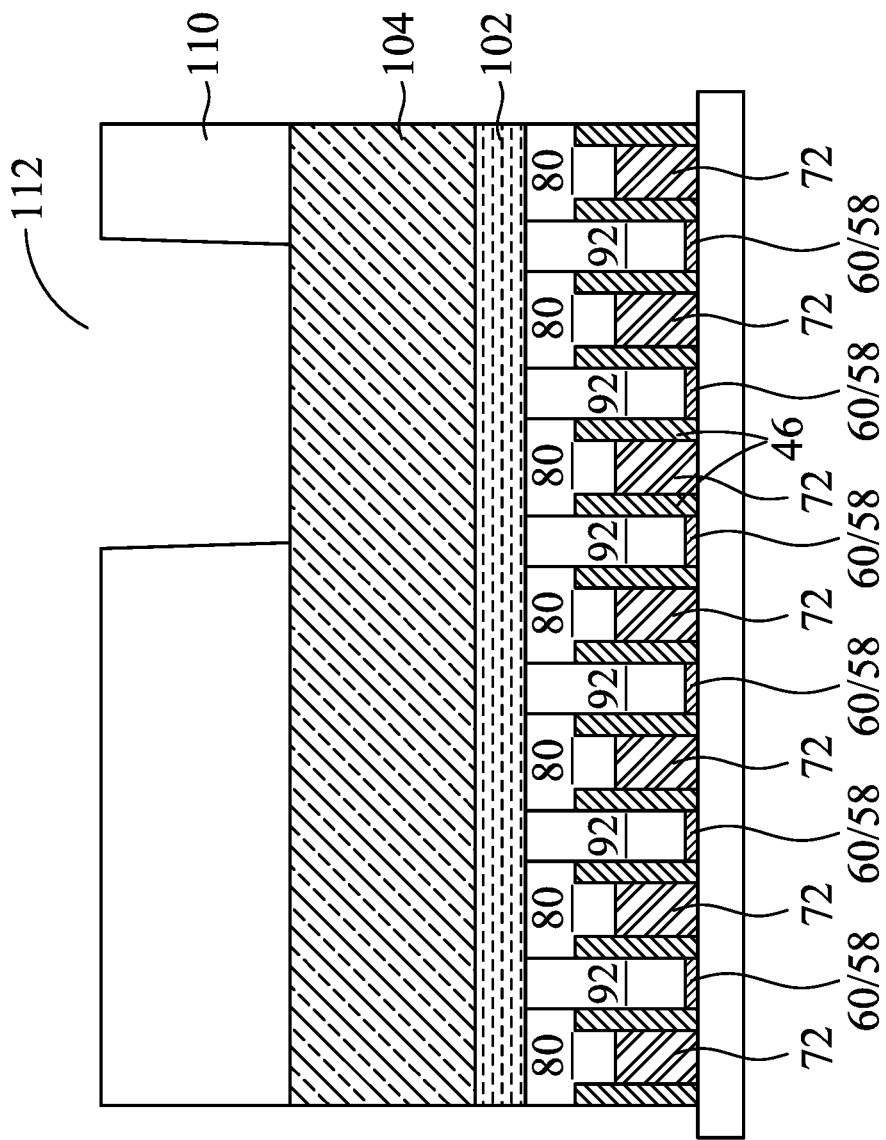
Figure 19D:
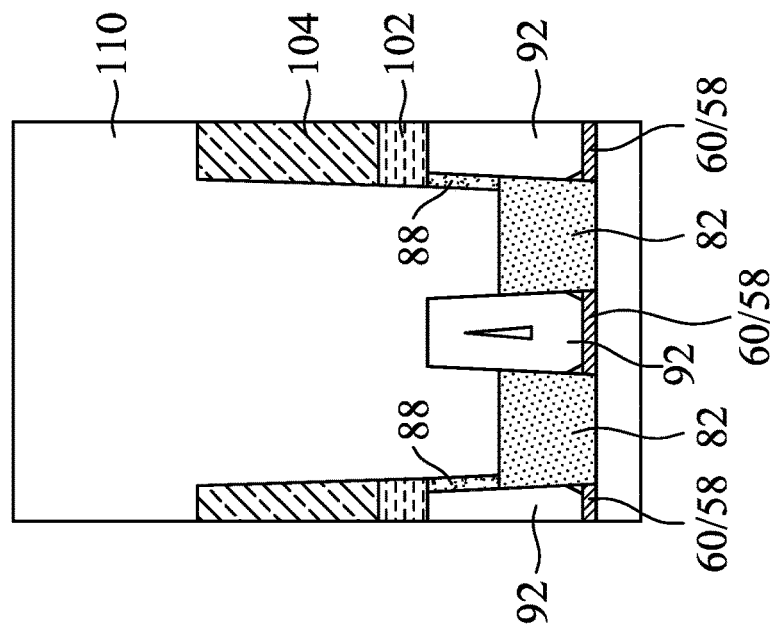
Figure 19C:
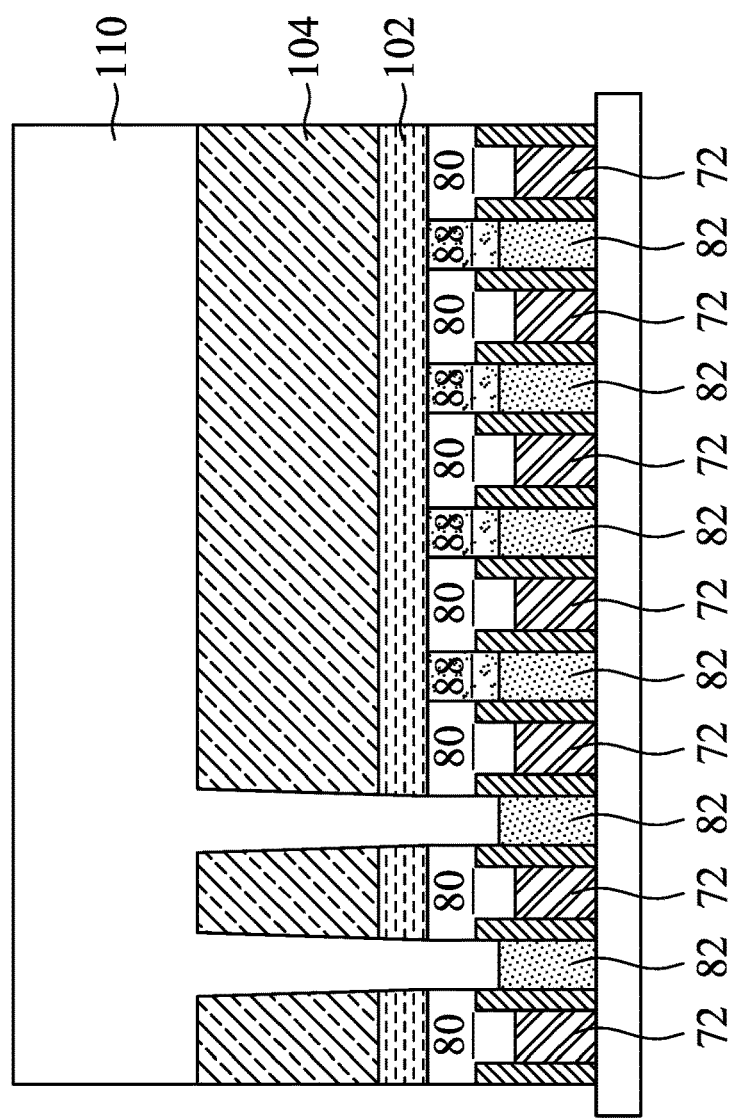
Figure 20A:
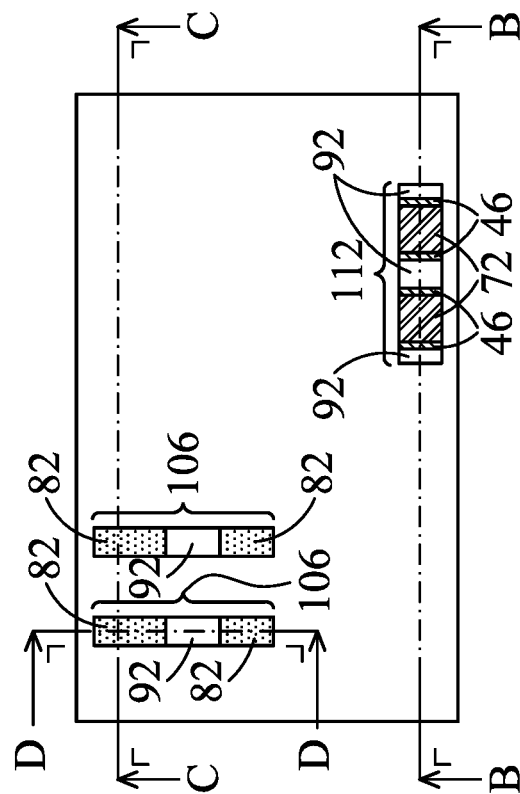
Figure 20B:
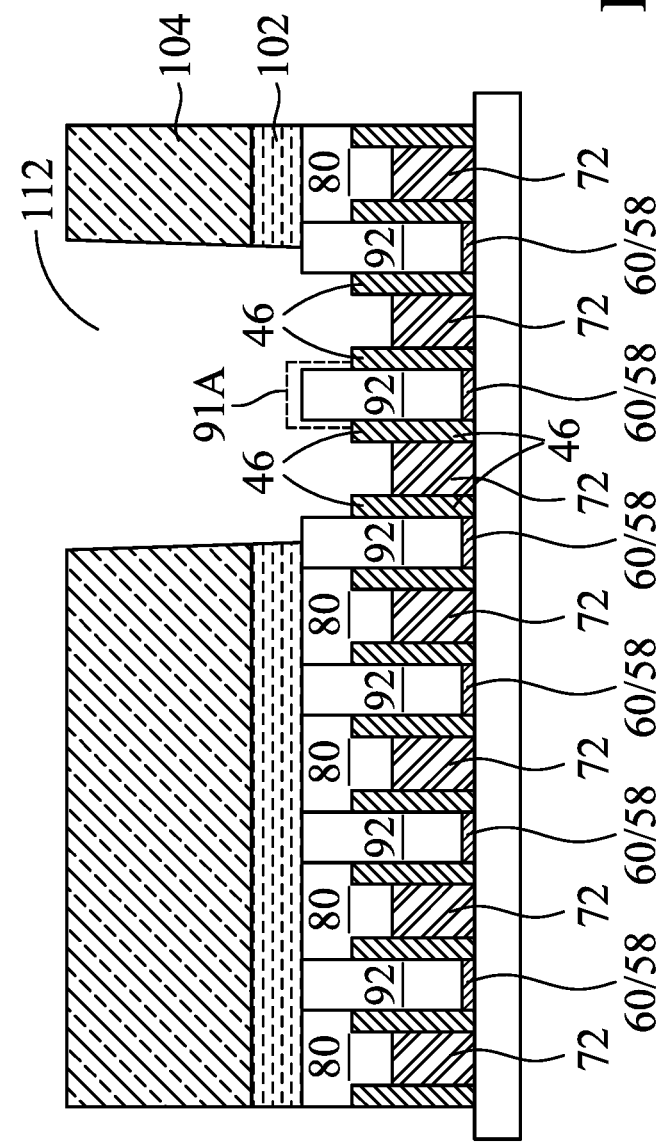

FIGS. 19A, 19B, 19C, and 19D and FIGS. 20A, 20B, 20C, and 20D illustrate the formation of slot gate contact openings. The respective process is illustrated as process 234 in the process flow 200 shown in FIG. 23. FIGS. 19A, 19B, 19C, and 19D illustrate the formation and the patterning of photo resist 110, in which a slot opening 112 is formed, as shown in FIGS. 19A and 19B. Next, photo resist 110 is used as an etching mask to etch the underlying hard mask 104 and etch stop layer 102, so that slot opening 112 extends into hard mask 104 and etch stop layer 102, as shown in FIG. 20B. Two the etching process.

After the hard mask 104 and etch stop layer 102 are etched, the exposed dielectric hard masks 80 are etched, revealing the underlying gate stacks 72, as shown in FIGS. 20A and 20B. The respective process is also illustrated as process 234 in the process flow 200 shown in FIG. 23. Slot opening 112 thus has portions extending down to a level lower than the top surfaces of the third dielectric hard masks 92, and the respective portions are referred to as slot opening extensions hereinafter. The etching of dielectric hard masks 80 is performed using an etchant, so that there is a high etching selectivity value (the ratio of the etching rate of dielectric hard masks 80 to the etching rate of dielectric hard masks 92), for example, higher than about 20, 30, or higher. As a result, as shown in FIG. 20B, dielectric hard mask 92 is not etched, and remains to separate the neighboring slot opening extensions from each other. Furthermore, in the etching, the etching selectivity (the etching rate of dielectric hard masks 80 to the etching rate of dielectric hard masks 88) may range between about 1.0 and about 50, for example. Photo resist 110 is then removed.

By forming dielectric hard masks 92 with a selected material different from the materials of dielectric hard masks 80 and 88, it is possible to have high etching selectivity values when dielectric hard masks 80 and 88 are etched, so that during the formation of the slot source/drain contact openings 106 and slot gate contact openings 112, dielectric hard masks 92 are not recessed. Otherwise, if dielectric hard masks 92 are not formed to replace the corresponding portions of ILD 60, the top portions of the otherwise ILD 60 in regions 91A (FIG. 20B) and 94B (FIG. 20D) will be recessed in the formation of slot openings.

In above-discussed processes, two source/drain contact plugs 82 are exposed to slot source/drain contact opening 106 as an example, and two gate stacks 72 are exposed to slot gate contact opening 112 as an example. In accordance with some embodiments of the present disclosure, slot source/drain contact opening 106 and slot gate contact opening 112 may be formed more elongated, so that three or more source/drain contact plugs 82 may be exposed to the same slot source/drain contact opening 106, and three or more gate stacks 72 may be exposed to the same slot gate contact opening 112.

Figure 20D:
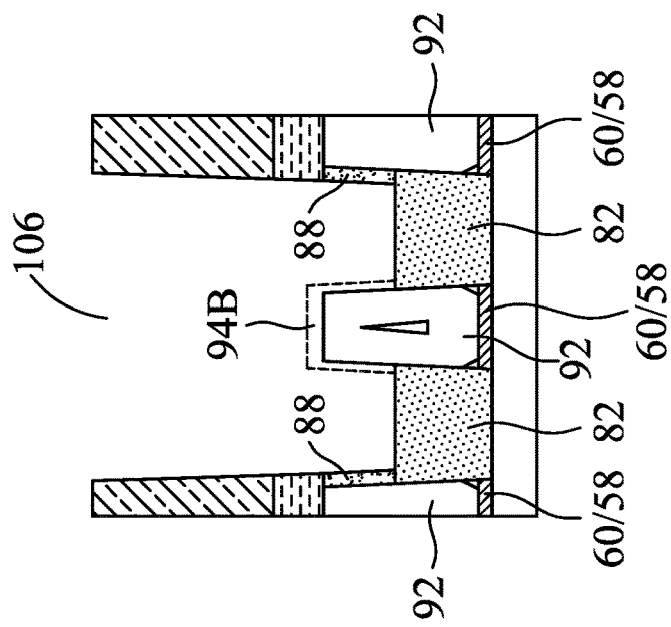
Figure 20C:
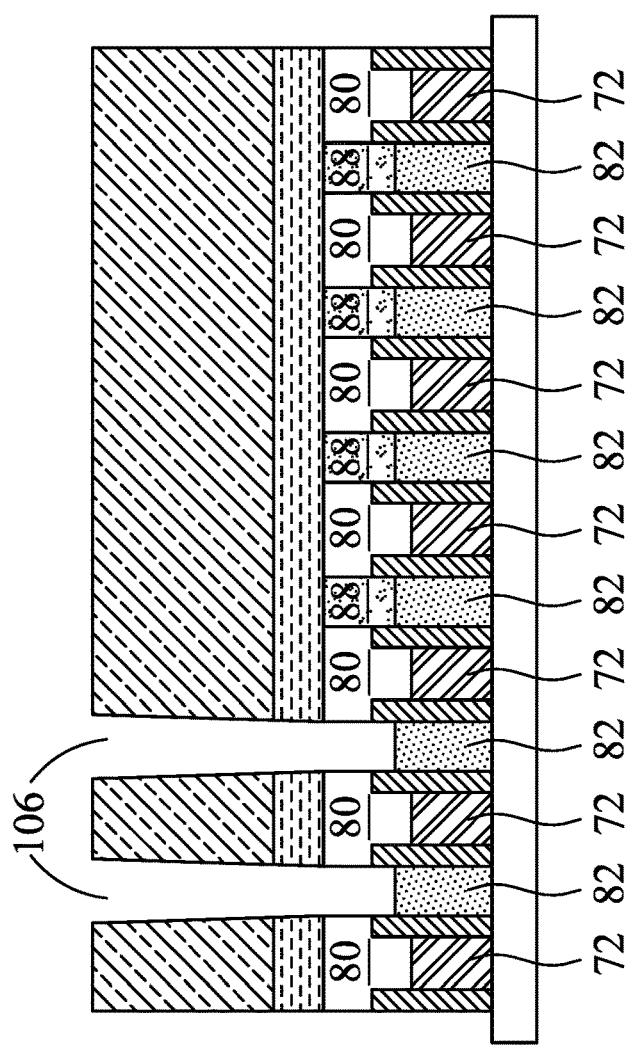

As is shown in FIGS. 20B and 20D, both slot opening 106 and 112 are preserved in hard mask 104 and etch stop layer 102. Two (or more) source/drain contact plugs 82 are underlying and exposed to the same slot source/drain contact opening 106, and two (or more) gate stacks 72 are underlying and exposed to the same slot gate contact opening 112.

Source/drain contact plugs and gate contact plugs are then formed in openings 106 and 112. The respective process is illustrated as process 236 in the process flow 200 shown in FIG. 23. The formation process may include filling a conductive material(s) into openings 106 and 112, and performing a planarization process such as a CMP process or a mechanical grinding process to remove excess portions of the conductive material. The resulting gate contact plugs 114 and source/drain contact plugs 116 are shown in FIGS. 21A, 21B, 21C, and 21D. The illustrated gate contact plugs 114 may belong to different FinFETs. The source/drain contact plugs 116 may also belong to different FinFETs. In accordance with some embodiments of the present disclosure, the filled conductive material includes a diffusion barrier layer, which may be formed of titanium nitride, tantalum nitride, titanium, or tantalum, and a filling material such as copper, tungsten, cobalt, ruthenium, or the like.

Figure 21D:
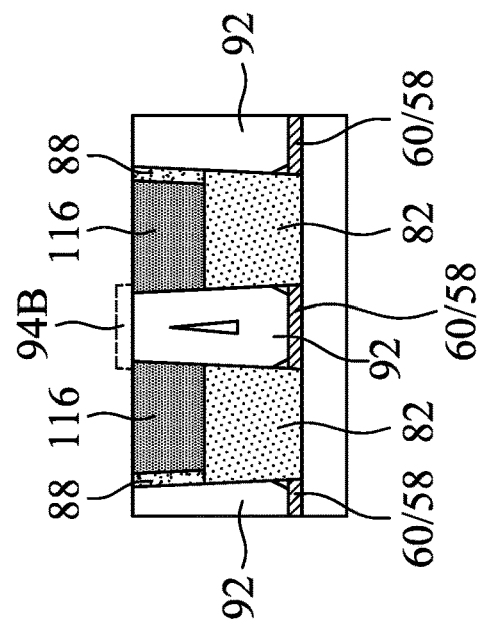
Figure 21C:
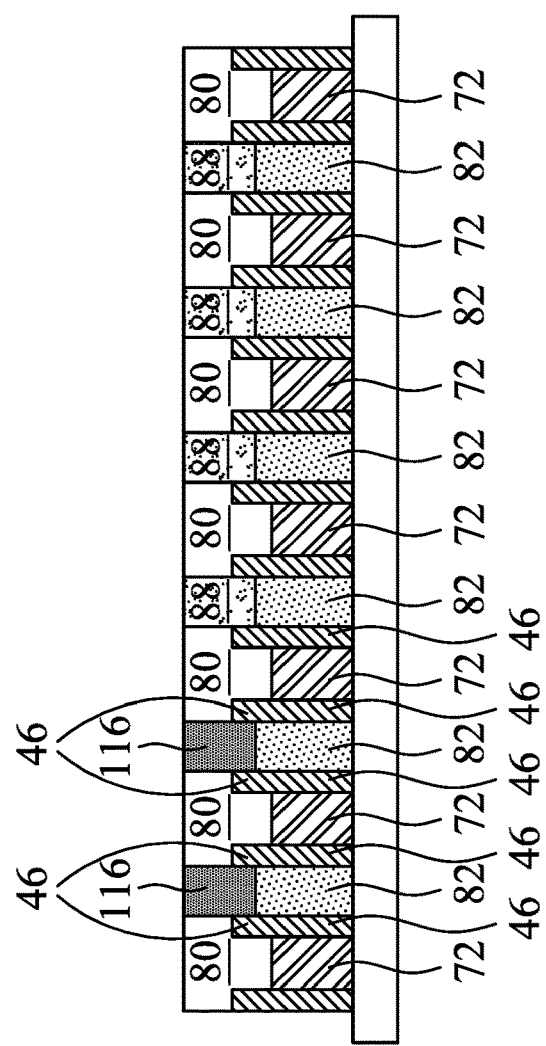

As shown in FIGS. 21A and 21B, two neighboring gate contact plugs 114 are separated from each other by a dielectric hard mask 92 therebetween. As aforementioned, the material of dielectric hard mask 92 is selected, so that it is not recessed in the formation of the openings in which gate contact plugs 114 are filled. If dielectric hard masks 92 are not formed, however, ILD 60 may occupy the spaces of dielectric hard masks 92, and may be recessed when slot contact opening 106 (FIG. 18D) is formed, region 94A (FIG. 21B) may become a recess when gate contact openings are formed. This will cause the electrical shorting of the neighboring gate contact plugs 114. Accordingly, by forming dielectric hard masks 92, the electrical shorting of the neighboring gate contact plugs 114 is eliminated. Similarly, the formation of dielectric hard mask 92 in region 94B (FIG. 21D) makes it more resistant to the damage in the formation of the source/drain contact openings. Accordingly, the electrical shorting of the neighboring source/drain contact plugs 116 is eliminated.

Figure 22:
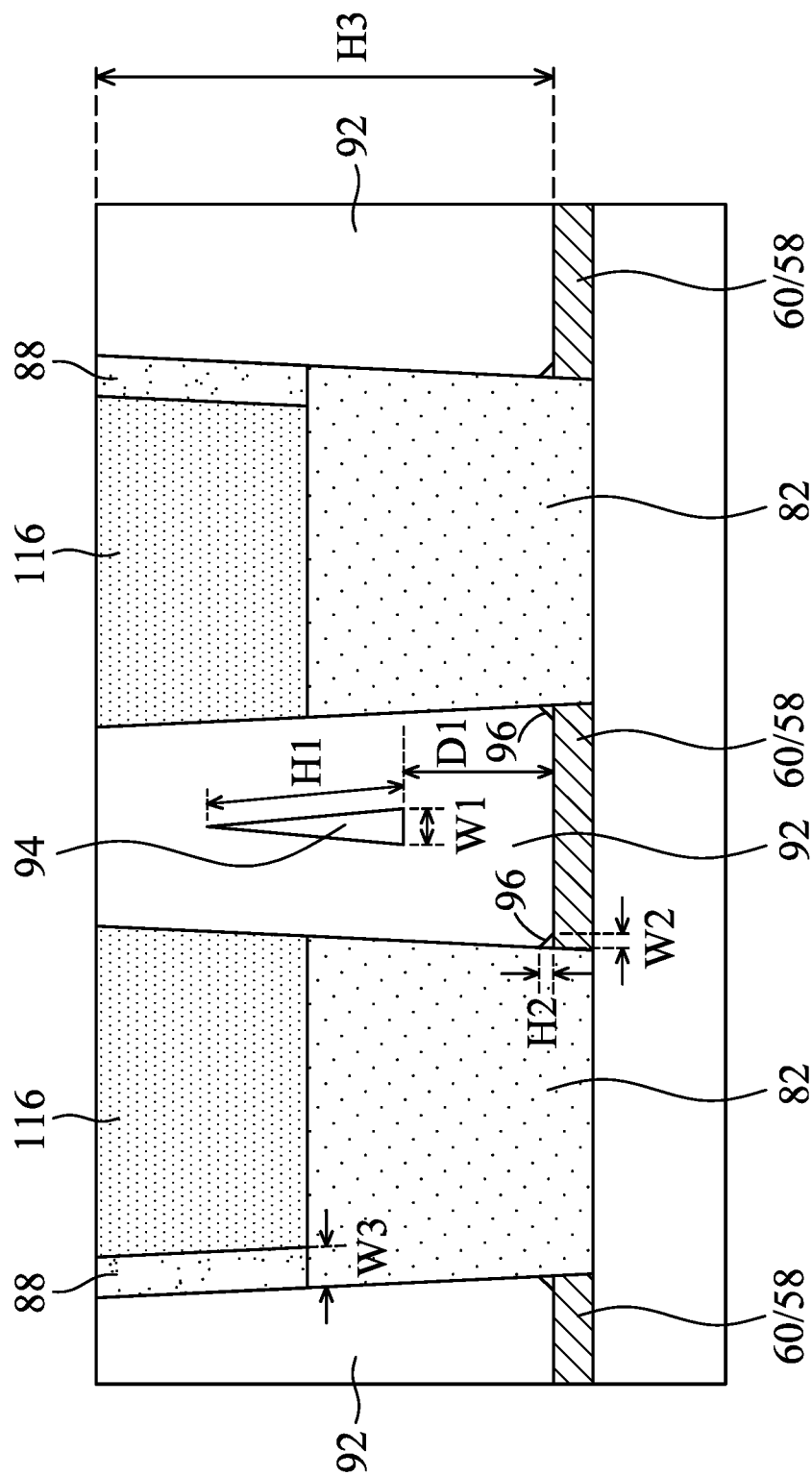
FIG. 22 illustrates an amplified view of a portion of slot source/drain contact plugs in accordance with some embodiments.

FIG. 22 illustrates an amplified view of FIG. 21D. In accordance with some embodiments of the present disclosure, air gap 94 has a height H1 in the range between about 0 nm and about 50 nm, with a width W1 in the range between about 0 nm and about 30 nm. Voids 96 may have heights H2 in the range between about 0 nm and about 50 nm, with a width W2 in the range between about 0 nm and about 30 nm. The vertical distance D1 from the bottom of air gap 94 to the top of the underlying ILD 60 may be in the range between about 0 nm and about 60 nm. The width W3 of the remaining dielectric hard mask 88 may be in the range between about 0 nm and about 30 nm. On the sidewalls of the illustrated dielectric hard mask 92, there is no remaining dielectric hard mask 88, and source/drain contact plugs 116 are in physical contact with dielectric hard mask 92, while each of the remaining dielectric hard masks 88 as illustrated in FIG. 21D may or may not exist, depending on the size of the slot source/drain contact opening. The height H3 of dielectric hard mask 92 (FIG. 21B) may be in the range between about 1 nm and about 40 nm. Also, the ratio of the height H3 to the total height of the portions of ILD 60 and CESL 58 directly underlying dielectric hard mask 92 may be in the range between about 0.2 and about 12.

The embodiments of the present disclosure have some advantageous features. With the reduction of the feature sizes in integrated circuits, the sizes of source/drain contact plugs and gate contact plugs are reduced. It becomes harder to form the contact plugs with small sizes, for example, due to the limitation of the photo lithography processes. To overcome this limitation, slot contact plugs are formed, so that a plurality of source/drain contact plugs are formed through the same slot source/drain contact opening, and a plurality of gate contact plugs are formed through the same slot gate contact opening. However, the source/drain contact plugs formed through the same slot opening suffers from electrical shorting problem due to the damage of ILD, and the gate contact plugs formed through the same slot opening also suffers from electrical shorting due to the damage of ILD. This problem is solved by forming dielectric hard masks 92. In addition, with the distance between neighboring gate contact plugs (or source/drain contact plugs) being small, the possibility of the dielectric breakdown also increases. Dielectric hard masks 92 may thus be formed using a material that has a higher breakdown voltage than ILD in accordance with the embodiments of the present disclosure.

In accordance with some embodiments of the present disclosure, a method of forming an integrated circuit structure comprises forming a first source/drain contact plug over and electrically coupling to a source/drain region of a transistor; forming a first dielectric hard mask overlapping a gate stack; recessing the first source/drain contact plug to form a first recess; forming a second dielectric hard mask in the first recess; recessing an inter-layer dielectric layer to form a second recess; and forming a third dielectric hard mask in the second recess, wherein the third dielectric hard mask contacts both the first dielectric hard mask and the second dielectric hard mask. In an embodiment, the forming the third dielectric hard mask comprises a planarization process to planarize top surfaces of the first dielectric hard mask, the second dielectric hard mask, and the third dielectric hard mask with each other. In an embodiment, the method further includes, after the third dielectric hard mask is formed, removing the second dielectric hard mask to form a third recess. In an embodiment, the method further includes filling a conductive material into the third recess to form a second source/drain contact plug over and contacting the first source/drain contact plug, wherein a sidewall of the second source/drain contact plug contacts a sidewall of the first dielectric hard mask to form a substantially vertical interface. In an embodiment, the second dielectric hard mask is removed using an etchant, and the third dielectric hard mask is exposed to the etchant, and is not etched. In an embodiment, the method further includes, after the third dielectric hard mask is formed, removing the first dielectric hard mask to form a fourth recess. In an embodiment, the method further includes, filling a conductive material into the fourth recess to form a gate contact plug over and contacting the gate stack, wherein a sidewall of the gate contact plug contacts a sidewall of the third dielectric hard mask to form a substantially vertical interface. In an embodiment, the first dielectric hard mask is removed using an etchant, and the third dielectric hard mask is exposed to the etchant, and is not etched. In an embodiment, the forming the third dielectric hard mask comprises forming a high-k dielectric region. In an embodiment, an air gap is sealed in the third dielectric hard mask.

In accordance with some embodiments of the present disclosure, a method of forming an integrated circuit structure comprises recessing an inter-layer dielectric to from a first recess; filling the first recess with a first dielectric hard mask; forming a hard mask over the first dielectric hard mask and two second dielectric hard masks, wherein the two second dielectric hard masks are on opposite sides of, and contacting, the first dielectric hard mask; forming a slot opening in the hard mask to reveal the first dielectric hard mask and the two second dielectric hard masks; removing the two second dielectric hard masks using etching to form slot opening extensions, wherein underlying conductive features are exposed to the slot opening extensions, and the underlying conductive features comprise gate stacks or source/drain contact plugs, wherein the first dielectric hard mask is exposed in the etching, and remains after the etching; filling a conductive material, wherein the conductive material comprises a first portion in the slot opening and second portions in the slot opening extensions; and removing the first portion of the conductive material, wherein the second portions of the conductive material are left to form two contact plugs physically separated from each other. In an embodiment, the underlying conductive features comprise source/drain contact plugs, and the two contact plugs comprise two additional source/drain contact plugs. In an embodiment, the underlying conductive features comprise gate stacks, and the two contact plugs comprise two gate contact plugs. In an embodiment, when the two second dielectric hard masks are removed, the two second dielectric hard masks and the first dielectric hard mask have an etching selectivity higher than about 20. In an embodiment, the removing the first portion of the conductive material comprises a planarization process, and wherein the first dielectric hard mask is exposed after the planarization process.

In accordance with some embodiments of the present disclosure, an integrated circuit structure comprises a first gate stack and a second gate stack; an inter-layer dielectric between the first gate stack and the second gate stack; a dielectric hard mask overlapping and contacting the inter-layer dielectric, wherein the dielectric hard mask and the inter-layer dielectric are formed of different materials; a first gate contact plug over and contacting the first gate stack; and a second gate contact plug over and contacting the second gate stack, wherein the first gate contact plug and the second gate contact plug are separated from each other by the dielectric hard mask, and sidewalls of the first gate contact plug and the second gate contact plug contact sidewalls of the dielectric hard mask to form substantially vertical interfaces. In an embodiment, top surfaces of the first gate contact plug, the second gate contact plug, and the dielectric hard mask are coplanar. In an embodiment, the dielectric hard mask is formed of a high-k dielectric material. In an embodiment, the integrated circuit structure further comprises gate spacers on opposite sides of the first gate stack and the second gate stack, wherein a bottom surface of the dielectric hard mask is lower than top surfaces of the gate spacers. In an embodiment, a top surface of the dielectric hard mask is higher than the top surfaces of the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a plurality of source/drain regions;
    a plurality of gate stacks, each between two of the plurality of source/drain regions;
    a gate contact plug over and contacting one of the plurality of gate stacks; and
    a first plurality of strips parallel to each other, wherein a discrete strip among the first plurality of strips comprises:
        a plurality of source/drain contact plugs over and electrically coupling to the plurality of source/drain regions; and
        a conductive feature over and contacting a source/drain contact plug among the plurality of source/drain contact plugs, wherein the conductive feature is formed of a same material as the gate contact plug, and wherein a first sidewall of the source/drain contact plug is vertically aligned to a second sidewall of the conductive feature.

2. The structure of claim 1, wherein the source/drain contact plug further comprises a third sidewall opposing the first sidewall, and the conductive feature further comprises a fourth sidewall opposing the second sidewall, and wherein the fourth sidewall is offset from the third sidewall.

3. The structure of claim 2 further comprising a dielectric hard mask overlapping the source/drain contact plug, wherein the dielectric hard mask contacts the conductive feature and the source/drain contact plug.

4. The structure of claim 3, wherein the dielectric hard mask further comprises an additional sidewall vertically aligned to the third sidewall of the source/drain contact plug.

5. The structure of claim 1, wherein the discrete strip further comprises a dielectric hard mask contacting sidewalls of the conductive feature and the source/drain contact plug.

6. The structure of claim 5 further comprising an inter-layer dielectric underlying and contacting the dielectric hard mask.

7. The structure of claim 6, wherein the dielectric hard mask has a higher breakdown voltage than the inter-layer dielectric.

8. The structure of claim 6, wherein the dielectric hard mask comprises a high-k dielectric material.

9. The structure of claim 1, wherein in a top view of the structure, the conductive feature is elongated and has a first lengthwise direction parallel to a second lengthwise direction of the discrete strip.

10. A structure comprising:
    a first source/drain region and a second source/drain region;
    a first source/drain contact plug and a second source/drain plug over and electrically connected to the first source/drain region and the second source/drain region, respectively;
    a first metallic feature and a second metallic feature over and contacting the first source/drain contact plug and the second source/drain contact plug, respectively;
    a first dielectric hard mask between and contacting the first metallic feature and the second metallic feature; and
    a second dielectric hard mask and a third dielectric hard mask overlapping the first source/drain contact plug and the second source/drain contact plug, respectively, wherein the second dielectric hard mask and the third dielectric hard mask are on opposite sides of a combined region that comprises the first metallic feature, the second metallic feature, and first dielectric hard mask.

11. The structure of claim 10, wherein sidewalls of the first dielectric hard mask are further in contact with additional sidewalls of the first source/drain contact plug and the second source/drain contact plug.

12. The structure of claim 10, wherein the first source/drain contact plug comprises a first sidewall vertically aligned to a second sidewall of the second dielectric hard mask.

13. The structure of claim 10, wherein the second dielectric hard mask physically contacts the first metallic feature.

14. The structure of claim 10, wherein the first metallic feature and the second metallic feature comprise first top surfaces coplanar with a second top surface of the first dielectric hard mask.

15. The structure of claim 14, wherein the first top surfaces are further coplanar with third top surfaces of the second dielectric hard mask and the third dielectric hard mask.

16. The structure of claim 14, wherein the first dielectric hard mask comprises an air gap therein.

17. The structure of claim 14, wherein the first dielectric hard mask is formed of a first dielectric material different from dielectric materials of the second dielectric hard mask and the third dielectric hard mask.

18. A structure comprising:
a source/drain region;
a source/drain contact plug overlapping the source/drain region;
a first dielectric hard mask overlapping the source/drain contact plug;
a metallic feature overlapping the source/drain contact plug, wherein a first sidewall of the first dielectric hard mask is in contact with a second sidewall of the metallic feature;
an inter-layer dielectric and a contact etch stop layer; and
a second dielectric hard mask overlapping the inter-layer dielectric and the contact etch stop layer, wherein the second dielectric hard mask contacts both of a third sidewall of the source/drain contact plug and a fourth sidewall of the metallic feature, and wherein the second sidewall and the fourth sidewall are opposing sidewalls of the metallic feature.

19. The structure of claim 18, wherein the first dielectric hard mask and the second dielectric hard mask comprise different dielectric materials.

20. The structure of claim 18, wherein an additional first sidewall of the first dielectric hard mask is over and vertically aligned to an additional second sidewall of the source/drain contact plug.

* * * * *